US006977425B2

(12) United States Patent
Yoshida et al.

(10) Patent No.: US 6,977,425 B2
(45) Date of Patent: Dec. 20, 2005

(54) SEMICONDUCTOR DEVICE HAVING A LATERAL MOSFET AND COMBINED IC USING THE SAME

(75) Inventors: Kazuhiko Yoshida, Nagano (JP); Takeshi Ichimura, Nagano (JP); Tatsuhiko Fujihira, Nagano (JP); Naoki Kumagai, Nagano (JP)

(73) Assignee: Fuji Electric Co., Ltd., (JP)

( * ) Notice: Subject to any disclaimer, the term of this patent is extended or adjusted under 35 U.S.C. 154(b) by 0 days.

(21) Appl. No.: 10/442,648

(22) Filed: May 21, 2003

(65) Prior Publication Data

US 2004/0026728 A1 Feb. 12, 2004

(30) Foreign Application Priority Data

May 21, 2002 (JP) ............................ 2002-145903

(51) Int. Cl.[7] ............................................... H01L 29/00

(52) U.S. Cl. ..................... 257/517; 257/552; 257/557; 257/565

(58) Field of Search ................................ 257/500–510, 257/197–200, 487, 488, 492, 517, 552, 557, 257/556, 565; 438/205, 313, 340

(56) References Cited

U.S. PATENT DOCUMENTS 5,162,966 A * 11/1992 Fujihira ...................... 257/140
5,923,055 A * 7/1999 Schlangenotto et al. .... 257/147
6,093,588 A * 7/2000 De Petro et al. ............ 438/180
6,563,193 B1 * 5/2003 Kawaguchi et al. ........ 257/575
2002/0060340 A1 * 5/2002 Deboy et al. ............... 257/330
2003/0127687 A1 * 7/2003 Kumagai et al. ........... 257/335

FOREIGN PATENT DOCUMENTS

JP 2001-291827 A 10/2001
JP 2001-320047 A 11/2001
JP 2002-94063 A 3/2002

* cited by examiner

*Primary Examiner*—Hoai Pham
*Assistant Examiner*—Nathan W. Ha
(74) *Attorney, Agent, or Firm*—Rossi, Kimms & McDowell, LLP

(57) ABSTRACT

A semiconductor device realizes a high electrostatic discharge withstanding capability and a high surge withstanding capability within the narrow chip area of a lateral MOSFET used in integrated intelligent switching devices, double-integration-type signal input and transfer IC's, and combined power IC's. The semiconductor device includes a vertical bipolar transistor in which a base is electrically connected to an emitter and a collector, and a lateral MOSFET including a drain electrode connected to a surface electrode. The vertical bipolar transistor absorbs electrostatic discharge or surge energy when a high electrostatic discharge voltage or a high surge voltage is applied and limits the electrostatic discharge voltage or the surge voltage to be lower than the breakdown voltage of the lateral MOSFET.

14 Claims, 20 Drawing Sheets

SEMICONDUCTOR DEVICE HAVING A LATERAL MOSFET AND COMBINED IC USING THE SAME

BACKGROUND OF INVENTION

The present invention relates to a semiconductor device exhibiting a high electrostatic-discharge withstanding capability (hereinafter referred to as an "ESD withstanding capability") and a high surge withstanding capability. Specifically, the present invention relates to a semiconductor device constituting an integrated intelligent switching device, a combined signal input and transmission IC or a combined power IC.

Integrated intelligent switching devices, which incorporate a plurality of power semiconductor devices and a driving and controlling circuit on a same chip, have been used in on-vehicle electric equipment, various kinds of industrial equipment, motor controllers, office automation (OA) equipment, mobile (portable) equipment, household appliances and such equipment which are required to exhibit high noise withstanding capabilities including a high ESD withstanding capability and an electromagnetic compatibility (hereinafter referred to as an "EMC").

In the past, two primary methods, the dielectric separation technique and the pn-junction separation technique, have been employed to achieve sufficient isolation of the lateral MOSFET component so as to avoid parasitic malfunctions. FIG. 19 is a cross sectional view of a conventional integrated intelligent switching device that employs the dielectric separation technique. Referring now to FIG. 19, the conventional integrated intelligent switching device includes a lateral power MOSFET section 1 in the surface portion of an n-type layer 7 formed by the epitaxial growth technique, a CMOS circuit section 2 in the surface portion of an n-type layer 8 formed by the epitaxial growth technique and constituting a driving and controlling circuit for driving and controlling the lateral power MOSFET section 1, and a lateral surge absorber section 3 in the surface portion of an n-type epitaxial layer 9 formed by the epitaxial growth technique and including a surge absorber such as a bipolar transistor and a Zener diode. Hereinafter, the layer formed by the epitaxial growth technique will be referred to as the "epitaxial layer".

Epitaxial layers 7, 8 and 9 are insulated and isolated from each other by a silicon oxide film 5 and silicon oxide films 6 deposited on a p-type semiconductor substrate 4 and constituting a trench insulation and isolation structure. The discrete insulation structure described above prevents lateral parasitic malfunctions of lateral power MOSFET section 1, which would be caused by a surge voltage, applied noises and the operations of lateral power MOSFET section 1 itself.

FIG. 20 is a cross sectional view of a conventional integrated intelligent switching device that employs the pn-junction separation technique. Referring now to FIG. 20, the conventional integrated switching device includes a heavily doped buried epitaxial layer 15 on a p-type semiconductor substrate 4, and n-type epitaxial layers 7, 8 and 9 on heavily doped buried epitaxial layer 15. Heavily doped p-type semiconductor diffusion separation regions 16, biased at the earth potential, are between n-type epitaxial layers 7 and 8 and between n-type epitaxial layers 8 and 9. The heavily doped p-type semiconductor diffusion separation regions 16 and n-type epitaxial layers 7, 8 and 9, biased at a potential higher than that of separation regions 16, constitute a pn-junction reverse-bias separation structure, which prevents lateral parasitic malfunctions of lateral power MOSFET section 1.

When the device employing the dielectric separation technique is applied to automotive use which requires high ESD, noise, and surge withstanding capability, the area of the bipolar transistor or Zener diode constituting the lateral surge absorbing section 3 inevitably becomes large. The large area occupied by the bipolar transistor or Zener diode in the lateral surge absorbing section 3 reduces the effects of down-sizing obtained by narrowing the chip area. For improving the ESD withstanding capability and the surge withstanding capability of the semiconductor device constituting a lateral power MOSFET section 1, it is necessary to dispose a layer doped heavily enough to prevent the parasitic breakdown operation thereof or to widen the area of lateral power MOSFET section 1, sacrificing the on-resistance characteristics per a unit area.

For improving the high-current operations, the ESD withstanding capability and the noise withstanding capability of the semiconductor device constituting lateral power MOSFET section 1 in the device employing the pn-junction separation technique, it is necessary for lateral power MOSFET section 1 to be provided with a plurality of lateral bipolar transistors or a thyristor structure. The current flowing in the lateral devices causes potential variations between the devices or between the wells. The potential variations are liable to cause malfunctions or secondary breakdown. When the devices employing the pn-junction separation technique, which has the disadvantages as described above, are applied to the automotive use, a buried epitaxial layer 15 is disposed, or p-type semiconductor diffusion separation regions 16 are doped more heavily and used for a constituent element of a lateral Zener diode. However, the countermeasures described above do not substantially improve the characteristics of the lateral parasitic bipolar transistors and the thyristor. Since the chip area widened to improve the ESD withstanding capability or the surge withstanding capability is hazardous, the dielectric separation technique has been employed more often.

A combined power IC or a combined communication IC exhibiting a high surge voltage and a high ESD withstanding capability on a same chip requires an increase in the chip area and the manufacturing costse due to the reasons described above and in contradiction to the chip area reduction now in progress based on the down-sizing of the constituent elements. Therefore, a high ESD withstanding capability is realized in many cases by adding diodes, resistors and capacitors externally.

In view of the foregoing, it would be desirable to provide a semiconductor device that t facilitates forming a lateral MOSFET exhibiting a high ESD withstanding capability and a high surge withstanding capability in a smaller chip area, without the need for any complicated isolation structure.

It would be also desirable to provide integrated circuits incorporating such semiconductor devices such as an integrated intelligent switching device incorporating a plurality of power semiconductor devices and a circuit for driving and controlling the plurality of power semiconductor devices on a same chip, a combined signal input and transfer IC incorporating a plurality of digital and analog signal input and transfer circuits on a same chip, and an intelligent power IC further incorporating the device described above or the IC described above and a serial communication circuit for communicating between the device or the IC and a microcomputer.

SUMMARY OF INVENTION

The present invention provides a semiconductor device for use in integrated intelligent switching devices, double integration type signal input and transfer integrated circuits, and combined power integrated circuits. The device exhibits a high electrostatic discharge withstanding capability and a high surge withstanding capability within the narrow chip area of a lateral MOSFET without the use of complicated insulation structures.

The semiconductor device according to a first aspect of the invention includes a semiconductor substrate; a vertical bipolar transistor, the base and the emitter thereof short-circuited by a surface electrode and the collector thereof including the semiconductor substrate; and a lateral MOSFET, the source electrode or the drain electrode thereof connected electrically to the surface electrode via metal electrode wiring.

The semiconductor device according to a second aspect of the invention includes a semiconductor substrate; a vertical bipolar transistor, the base and the emitter thereof short-circuited by a surface electrode and the collector thereof including the semiconductor substrate; and a lateral MOSFET, the gate electrode thereof connected electrically to the surface electrode via an electrically conductive semiconductor resistor.

BRIEF DESCRIPTION OF THE DRAWINGS

FIG. 7(*b*) is a schematic cross sectional view along the line A—A of FIG. 7(*a*).

FIG. 7(*c*) is another schematic cross sectional view along the line A—A of FIG. 7(*a*).

DETAILED DESCRIPTION OF PREFERRED EMBODIMENTS

The design of the present invention is based on extensive investigations conducted by the present inventors, the results of which are described below to help explain the features and advantages of invention.

Figure 16:
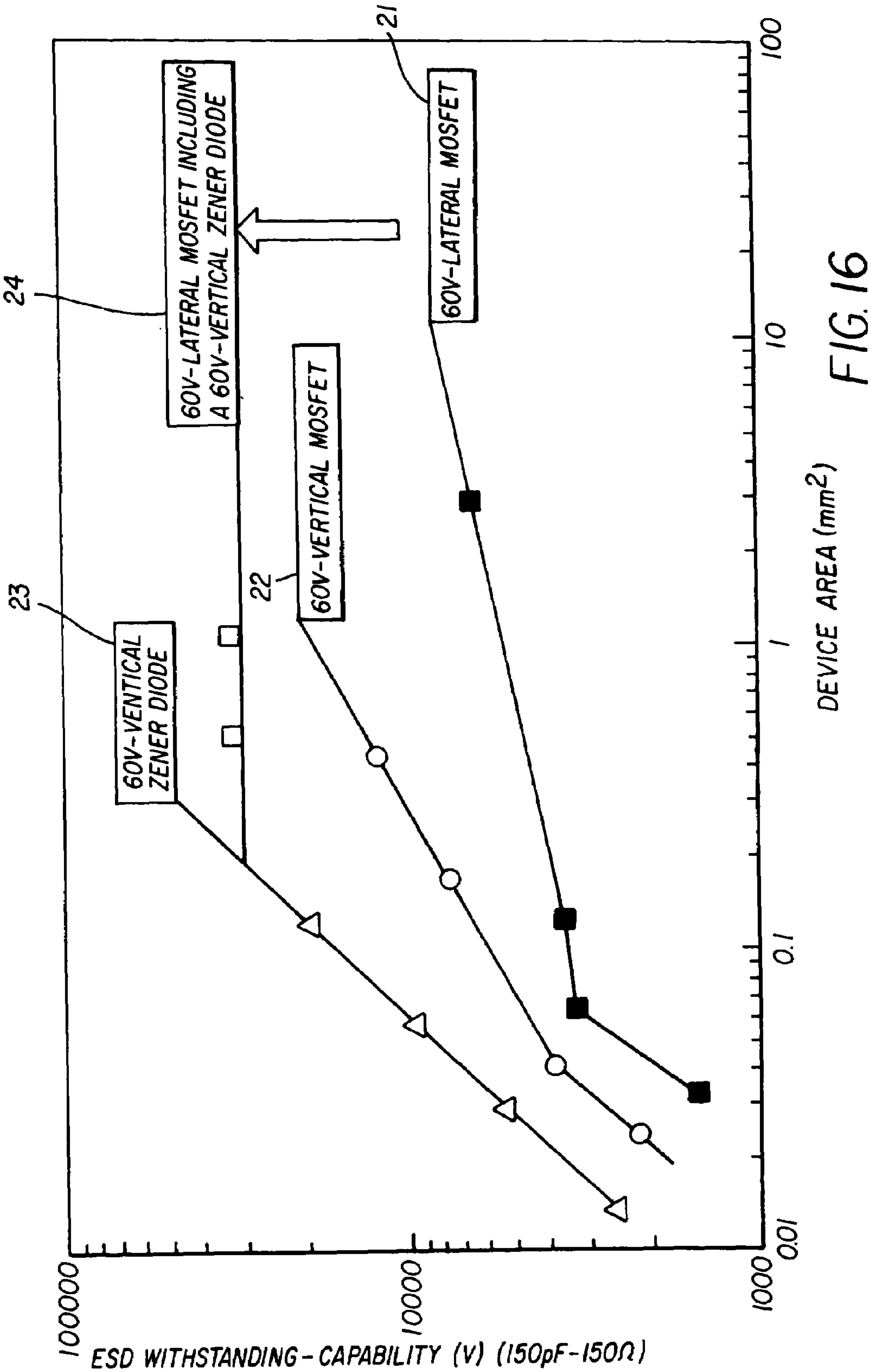
FIG. 16 are set of curves relating the ESD withstanding capability with the device area of a lateral MOSFET, a vertical MOSFET and a vertical Zener diode, the rated voltages thereof are 60V.

FIG. 16 describes the results of the experiments conducted by the present inventors that relate the ESD withstanding capability to the device area of a lateral MOSFET 21, a vertical MOSFET 22 and a vertical Zener diode 23, with rated voltages of 60 V. Identical substrates and process conditions are employed for the devices investigated. The breakdown voltages of the devices investigated are set at a certain value. The ESD withstanding capabilities are measured under the conditions of 150 pF and 150Ω, the conditions used in Japan to evaluate the semiconductor devices for automotive use. The required ESD withstanding capability for semiconductor devices intended for automotive use is from 10 kV to 15 kV. It is required for MOSFET's 21 and 22 to exhibit a substantial ESD withstanding capability of 25 kV or higher.

When the above described requirements are not met, a power IC including MOSFET's 21 and 22 is used in practice by adding external discrete parts such as protection capacitors, diodes and resistance. However, the additional external discrete parts increase the costs of the practical power IC. To achieve the ESD withstanding capability described above, it is necessary for the power IC including MOSFET's 21 and 22 to have a sufficiently wide device area as FIG. 16 indicates clearly. For realizing the ESD withstanding capability of 10 kV, it is necessary for lateral MOSFET 21 to have a wide device area of 10 $mm^2$ or wider. In contrast, vertical Zener diode 23 facilitates realizing an ESD withstanding capability of 30 kV by a narrow device area of 0.2 $mm^2$, which is almost the same as the pad electrode area.

As the structure of lateral MOSFET 21 has become finer and finer, the on-resistance per a unit area thereof has been reduced down to 1 $m\Omega cm^2$ at the rated voltage of 60 V. In the on-resistance range of several hundreds mΩ, most popular for automotive use, it is sufficient for the device area of lateral MOSFET 21 to be several $mm^2$. Since the areas of the devices mounted on a power IC will be narrower, the ESD withstanding capabilities thereof will be also lower. The present inventors have investigated the relations between the device areas of lateral MOSFET 21, vertical MOSFET 22 and the vertical Zener diode 23 and the ESD withstanding capabilities thereof quantitatively on a same scale. The approach facilitates quantitatively investigating the specific features and the problems of the respective ESD withstanding capabilities of lateral MOSFET 21, vertical MOSFET 22 and vertical Zener diode 23.

In FIG. 16, the experimental results of an experimental lateral MOSFET 24, with rated voltage of 60 V, are also described. Lateral MOSFET 24 includes a vertical Zener diode 23, with a rated voltage of 60 V and device area of 0.3 $mm^2$. Although the device area of lateral MOSFET 24 is 1 $mm^2$ or narrower, lateral MOSFET 24 including vertical Zener diode 23, buried beneath the drain electrode thereof, the source electrode thereof and the pads thereof, facilitates securing an ESD withstanding capability of more than 30 kV, beyond the limit of the measuring instrument and higher than the ESD withstanding capability of vertical MOSFET 22. The structure which short-circuits the base and the emitter of the vertical bipolar transistor (equivalent to a vertical Zener diode as a parasitic structure) was also compared experimentally. The comparative investigation has revealed that the short-circuited vertical bipolar transistor structure described above secures the ESD withstanding capability most effectively.

The present inventors investigated the relation between the working resistance and the ESD withstanding capability of vertical Zener diodes, with device area 0.1 $mm^2$ and rated voltage from 60 V to 120 V, which include a heavily doped epitaxial semiconductor substrate (hereinafter referred to as an "epitaxial substrate layer") of a first conductivity type and a semiconductor substrate (hereinafter referred to as a "bulk substrate layer") doped more heavily than the epitaxial substrate layer. The results obtained by changing the impurity concentrations and the thickness of the epitaxial substrate layer and the bulk substrate layer are described in FIG. 17. As FIG. 17 clearly indicates, the ESD withstanding capability decreases with increasing working resistance at a particular device area.

Figure 17:
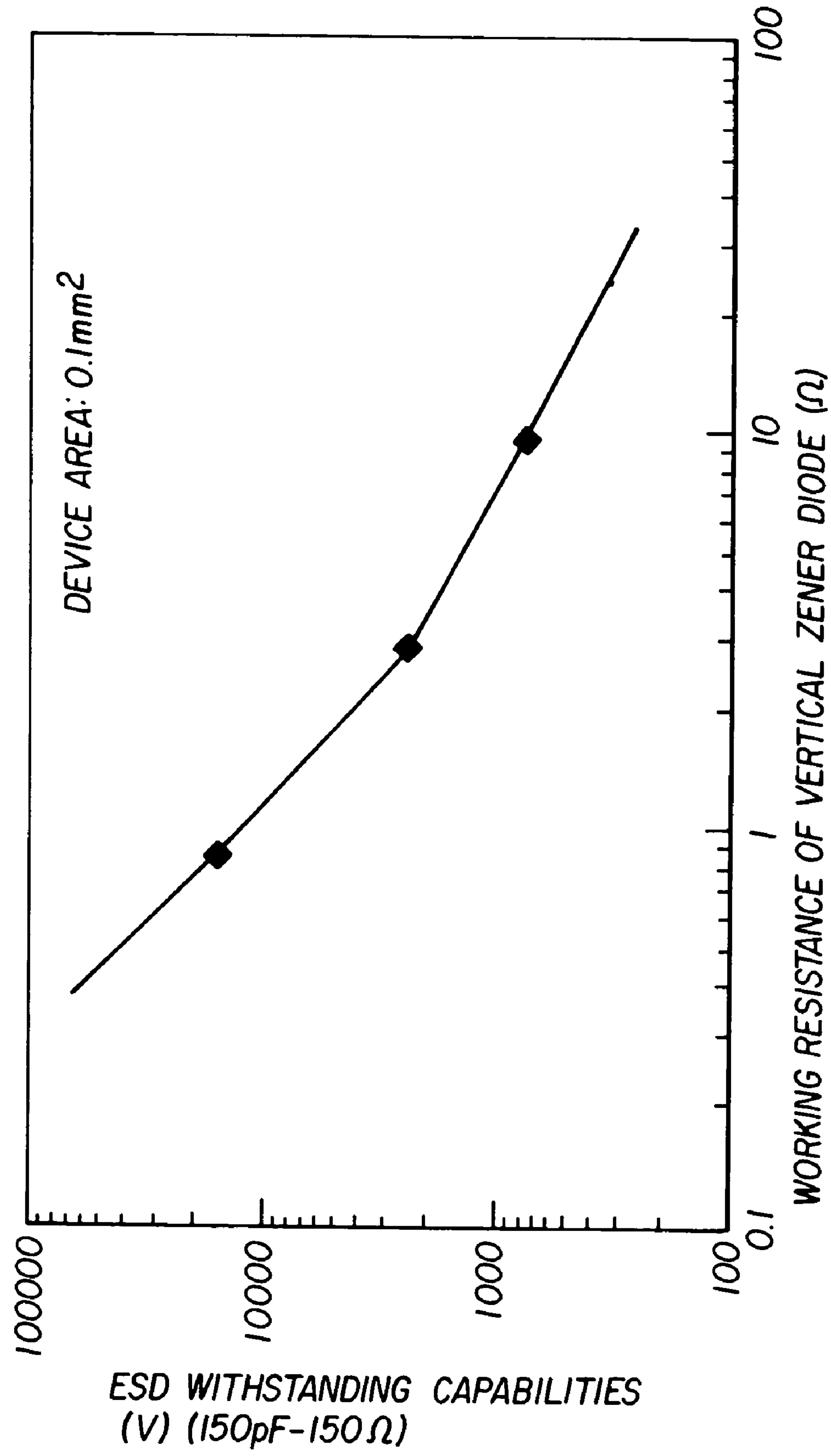
FIG. 17 is a curve relating the ESD withstanding capability and the working resistance of a vertical Zener diode, the rated voltage thereof is 60 V.

To obtain an ESD withstanding capability of 10 kV or higher, it is necessary, as FIG. 17 indicates, for the working resistance of the Zener diode to be 1Ω or lower. For obtaining an ESD withstanding capability of 1 kV or higher, it is necessary for the working resistance of the Zener diode to be 8Ω or lower. To obtain a higher ESD withstanding capability while maintaining the rated voltage, it is estimated, as the above described results indicate, that it is effective to use a heavily doped substrate and to form a diffusion layer doped more heavily than the heavily doped substrate. On the basis of the results described above, an ESD withstanding capability of 1 kV or higher can be achieved when the resistivity of the semiconductor substrate is from around 0.3 Ωcm to 10 Ωcm and the working resistance of the Zener diode is 8Ω or lower. Given these parameters, reach-through or punch-through occurs at a voltage higher than the rated voltage of 40 V for a device area of 0.1 $mm^2$, which is almost equivalent to the pad area.

Figure 18:
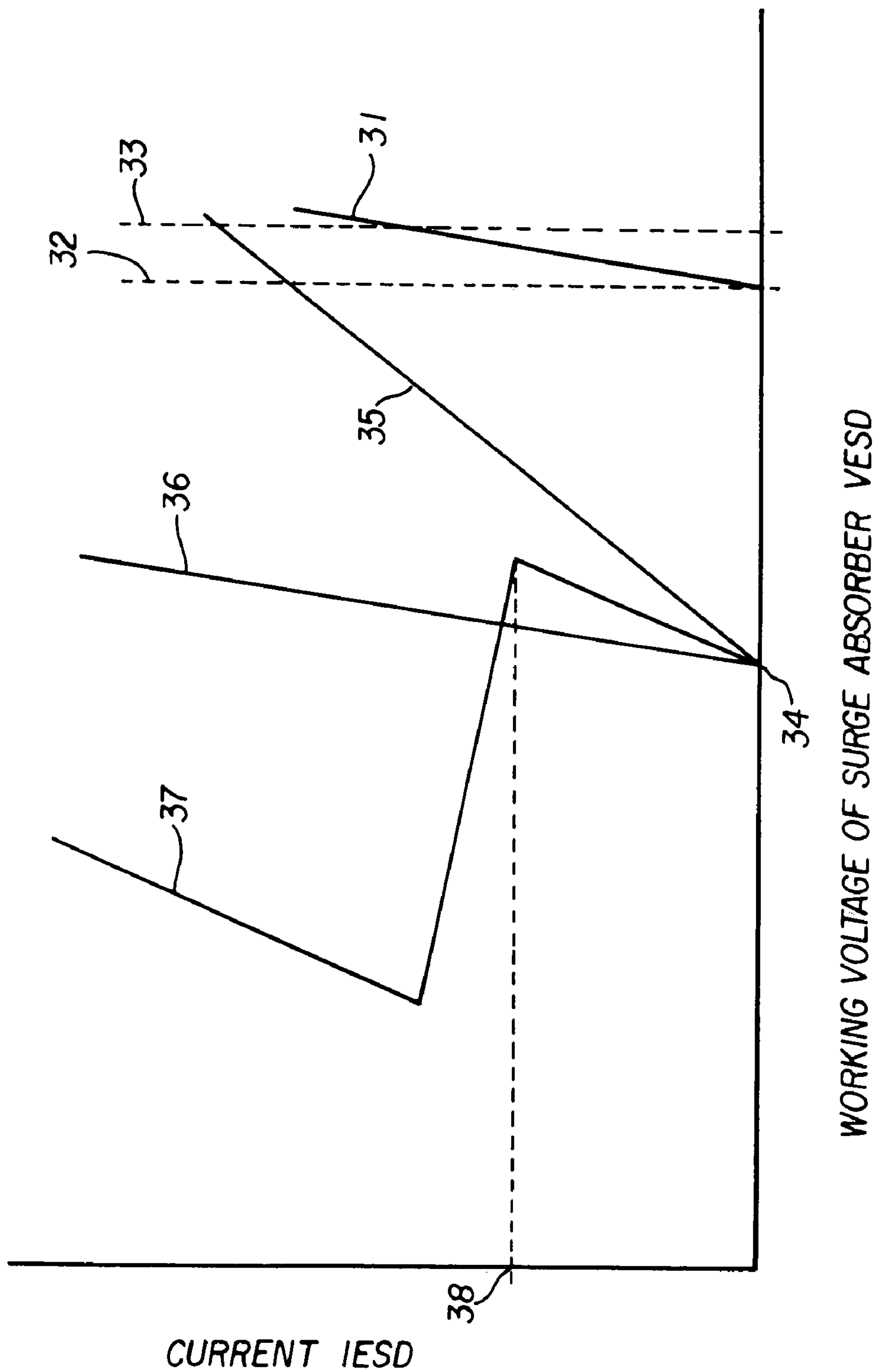
FIG. 18 is a set of lines schematically relating the currents caused by electrostatic discharge in the lateral MOSFET, the lateral Zener diode, the vertical Zener diode, and the vertical bipolar transistor with the working voltage of the surge absorber.
Figure 19:
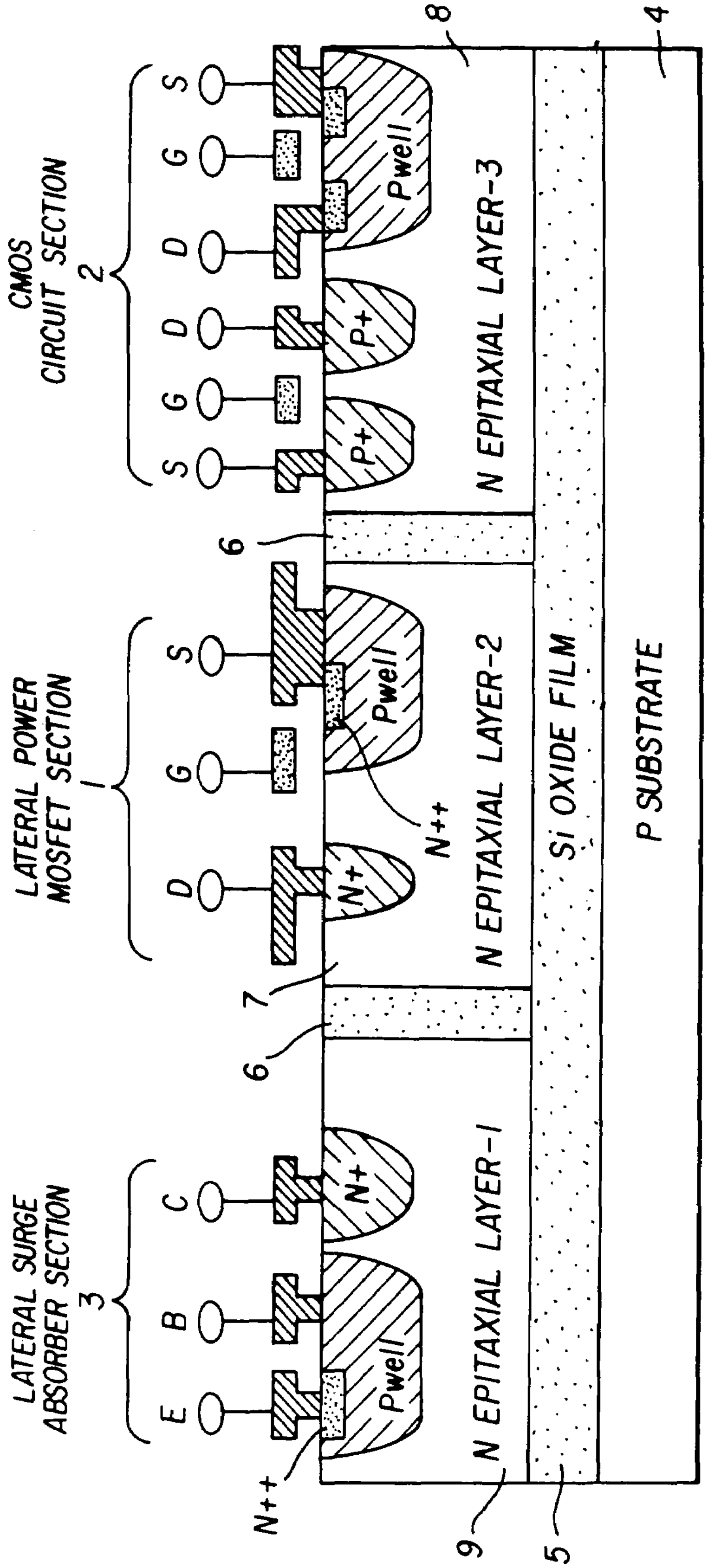
FIG. 19 is a cross sectional view of a conventional integrated intelligent switching device that employs the dielectric separation technique.
Figure 20:
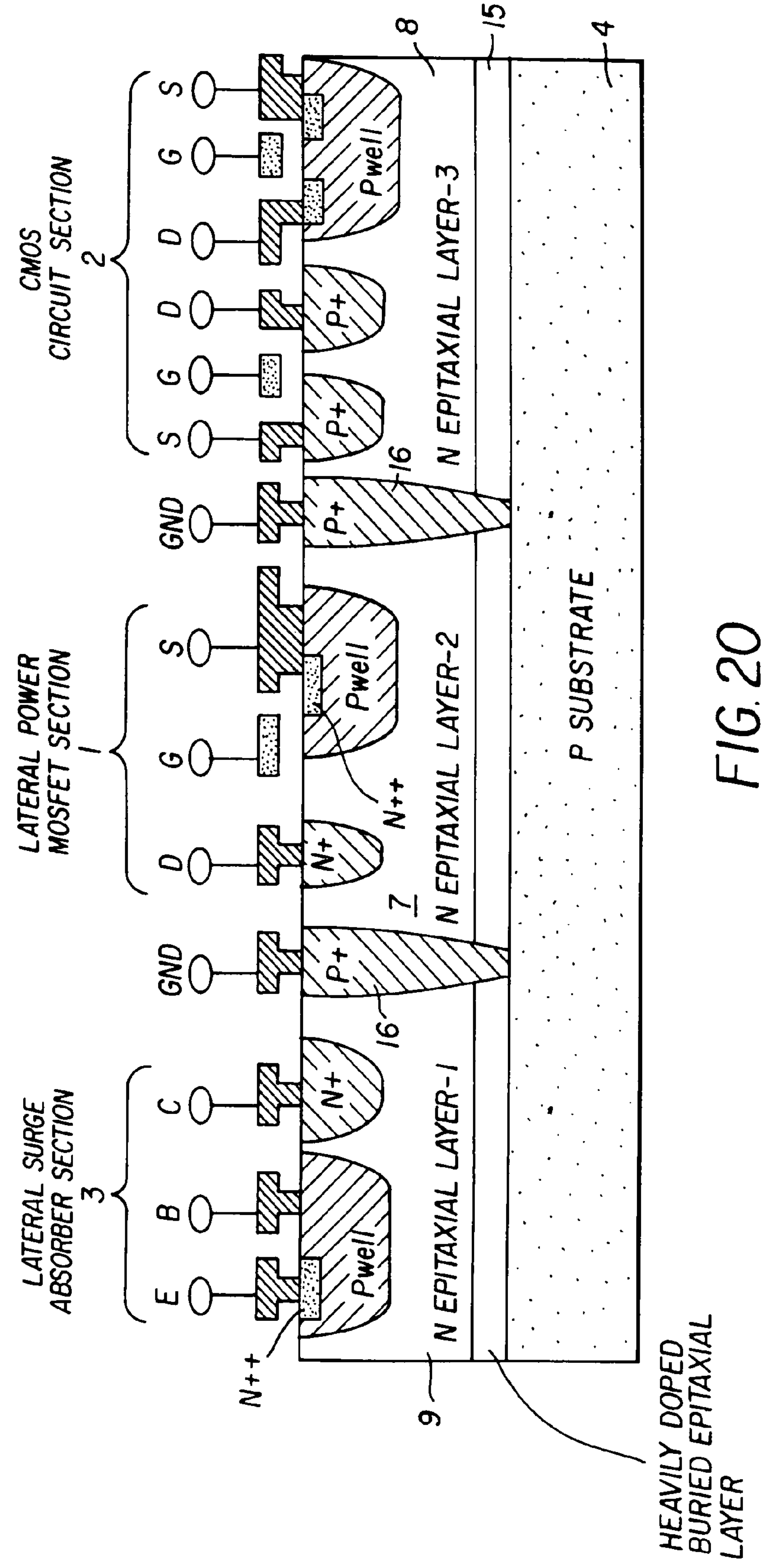
FIG. 20 is a cross sectional view of a conventional integrated intelligent switching device that employs the pn-junction separation technique.

As FIG. 18 indicates, the electrostatic discharge or the surge voltage is limited more effectively by employing a vertical bipolar transistor, the base and the emitter thereof are short-circuited to each other, for the protection device, rather than by employing a vertical Zener diode. In FIG. 18, the current caused by the breakdown of the lateral MOSFET is designated by the reference numeral 31, the current caused by the breakdown of the lateral Zener diode by the reference numeral 35, the current caused by the secondary breakdown of the vertical Zener diode by the reference numeral 36, and the current caused by the secondary breakdown of the vertical bipolar transistor by the reference numeral 37.

In FIG. 18, the reference numeral 32 designates the designed breakdown voltage of the lateral MOSFET and the reference numeral 33 designates the voltage which is a sum of the designed breakdown of the lateral MOSFET and a certain marginal voltage. The reference numeral 34 designates the breakdown voltage of the vertical surge absorber. The reference numeral 38 designates the working current, at which the vertical bipolar transistor is switched on. The heavily doped epitaxial substrate layer and the bulk substrate layer doped more heavily than the heavily doped epitaxial substrate layer effectively prevent parasitic bipolar operation in the lateral direction and parasitic thyristor operation in the lateral direction from causing. The parasitic bipolar operation and the parasitic thyristor operation in the lateral direction have been the problems of the combined power IC.

In the usual MOSFET operations, the vertical bipolar transistor works as a vertical Zener diode without affecting the usual MOSFET operations. When a high electrostatic discharge voltage or a high surge voltage is applied, the vertical bipolar transistor works to absorb the electrostatic discharge and the surge energy and suppresses the electrostatic discharge voltage and the surge voltage below the breakdown voltage of the lateral MOSFET.

The semiconductor device according to the invention may be provided with a vertical Zener diode in substitution for the vertical bipolar transistor, the base and emitter thereof are short-circuited. In this case, a high ESD withstanding capability and a high surge withstanding capability are obtained by setting the Zener voltage below the breakdown voltage of the lateral MOSFET and by adopting a structure, in which the working resistance of the Zener diode is sufficiently low.

First Mode

The semiconductor device according to a first mode for carrying out the invention includes a lateral MOSFET and a vertical surge absorber formed on a same semiconductor substrate without provision of any specific isolation structure, and metal electrode wiring connecting the drain electrode or the source electrode of the lateral MOSFET and the surface electrode of the vertical surge absorber. The invention will be described hereinafter with reference to the accompanied drawing figures which illustrate the first through sixth embodiments of the invention. In describing the second through sixth embodiments, the same reference numerals used in describing the first embodiment will be used to designate the same constituent elements and their duplicated descriptions will be omitted for the sake of simplicity.

Figure 1:
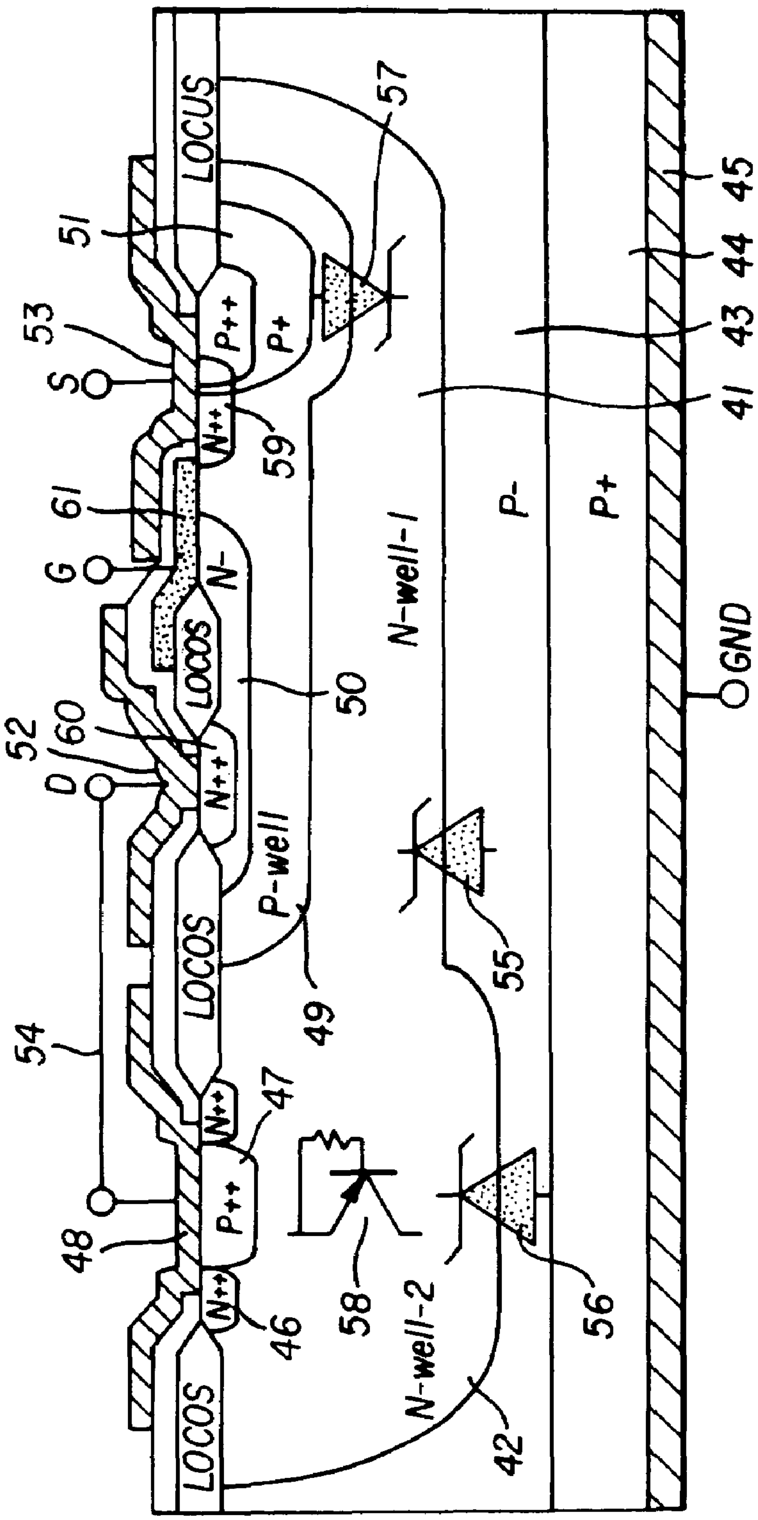
FIG. 1 is a cross sectional view of a semiconductor device according to a first embodiment of the invention.

FIG. 1 is a cross sectional view of a semiconductor device according to a first embodiment of the invention. Referring now to FIG. 1, the semiconductor device according to the first embodiment includes a heavily doped p-type semiconductor substrate 44, and a p-type epitaxial layer 43 on p-type semiconductor substrate 44. Epitaxial layer 43 is doped more lightly than semiconductor substrate 44. A first n-type well region 41 and a second n-type well region 42 are formed in the surface portion of epitaxial layer 43 in such an arrangement that first and second n-type well regions 41 and 42 are in contact with each other. A lateral MOSFET as a power semiconductor device is in first n-type well regions 41. A vertical pnp bipolar transistor as a vertical surge absorber is in second n-type well regions 42. In FIG. 1, a circuit diagram 58 of the vertical pnp bipolar transistor is shown. The lateral MOSFET and vertical pnp bipolar transistor 58 are isolated from each other by a LOCOS oxide film.

A p-type well region 49 is in a part of the surface portion of first n-type well region 41. A heavily doped p-type region 51, a heavily doped n-type source region 59, and an n-type expanded drain region 50 are in the surface portion of p-type well region 49. Heavily doped p-type region 51 and n-type source region 59 are in contact with each other and spaced apart from n-type expanded drain region 50. A gate electrode 61 is above the portion of p-type well region 49 between source region 59 and expanded drain region 50, that is above the channel region, with a gate oxide film interposed there between. A drain electrode 52 in contact with a drain region 60 in expanded drain region 50 is on the semiconductor structure. A source electrode 53 in contact with source region 59 is on the semiconductor structure.

An n-type base region 46 and a p-type emitter region 47 are in the surface portion of second n-type well region 42. Vertical pnp bipolar transistor 58 is formed of n-type base region 46, p-type emitter region 47, and the substrate working as the collector region thereof. A surface electrode 48 on vertical pnp bipolar transistor 58 is in contact with n-type base region 46 and p-type emitter region 47. In other words, the base and the emitter of vertical pnp bipolar transistor 58 are short-circuited. Surface electrode 48 is connected electrically to drain electrode 52 of the lateral MOSFET via metal electrode wiring 54. Surface electrode 48 and drain electrode 52 are biased, for example, at the power supply potential. A back electrode 45 is on the back surface of the substrate and biased, for example, at the earth potential.

In the semiconductor device having the structure illustrated in FIG. 1, a first vertical Zener diode 55 is formed across the pn-j unction plane between p-type epitaxial layer 43 and first n-type well region 41. A second vertical Zener diode 56 is formed across the pn-junction plane between p-type epitaxial layer 43 and second n-type well region 42. A parasitic diode 57 is formed across the pn-junction plane between p-type well region 49 and first n-type well region 41.

Figure 2:
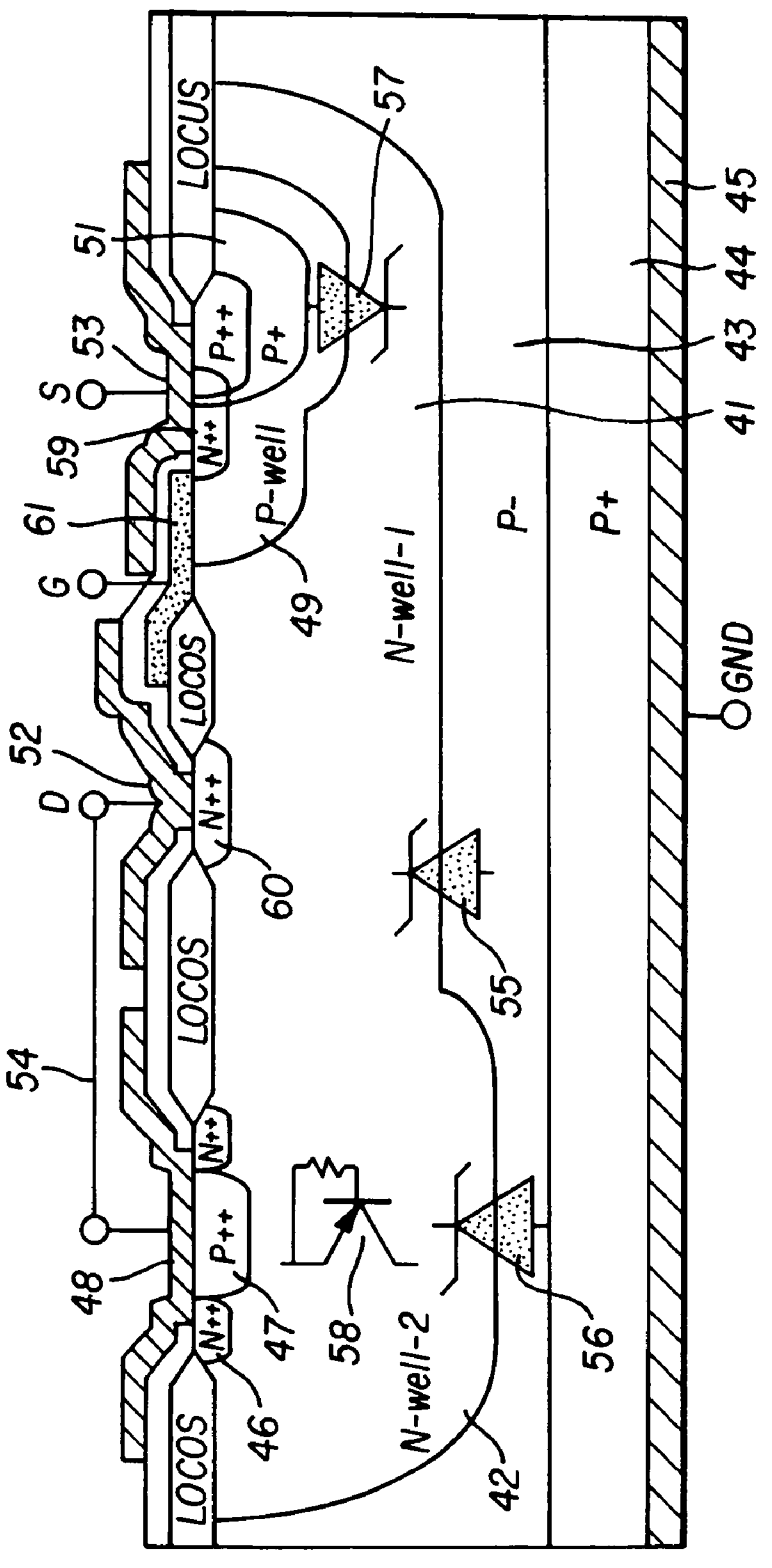
FIG. 2 is a cross sectional view of a semiconductor device according to a second embodiment of the invention.

FIG. 2 is a cross sectional view of a semiconductor device according to a second embodiment of the invention. Referring now to FIG. 2, p-type well region 49 is not extended to drain region 60. The semiconductor device according to the second embodiment does not include any expended drain region as designated by the reference numeral 50 in FIG. 1.

Figure 3:
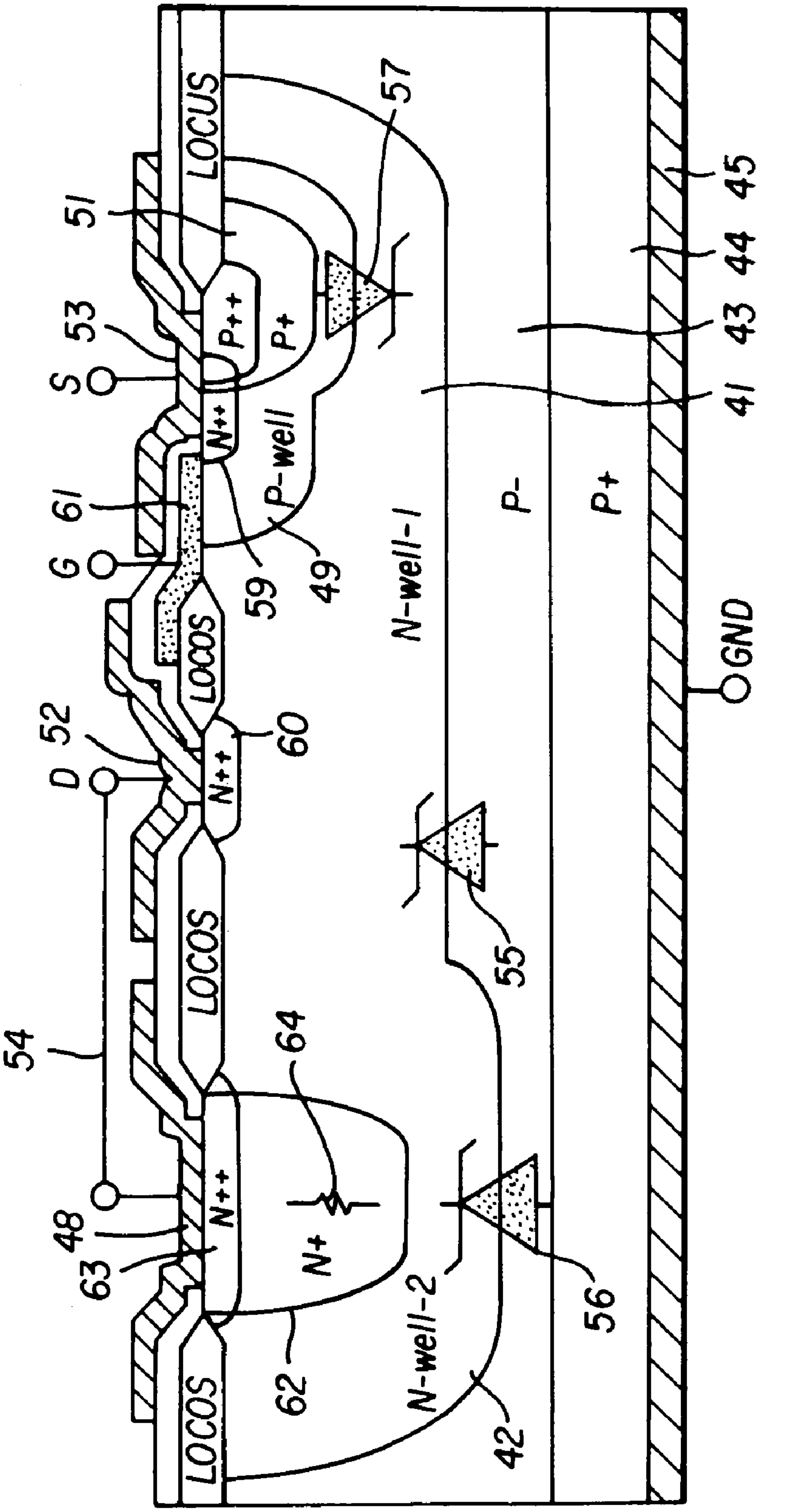
FIG. 3 is a cross sectional view of a semiconductor device according to a third embodiment of the invention.

FIG. 3 is a cross sectional view of a semiconductor device according to a third embodiment of the invention. Referring now to FIG. 3, the semiconductor device according to the third embodiment utilizes vertical Zener diode 56 as a vertical surge absorber. The semiconductor device according to the third embodiment does not include any vertical bipolar transistor as designated by the reference numeral 58 in FIG. 1. Therefore, the semiconductor device according to the third embodiment does not include any base region as designated by the reference numeral 46 in FIG. 1 nor any emitter region as designated by the reference numeral 47 in FIG. 1. Instead, the semiconductor device according to the third embodiment includes a heavily doped n-type region 62 in second n-type well region 42 and below surface electrode 48.

The n-type region 62 is connected electrically to surface electrode 48 via an n-type region 63 doped more heavily than n-type region 62. Diffusion resistance 64 of n-type region 62 is shown in FIG. 3. In the same manner as the semiconductor device according to the second embodiment, the semiconductor device according to the third embodiment does not include any expanded drain region as designated by the reference 50 in FIG. 1. In the same manner as in the semiconductor device according to the second embodiment, p-type well region 49 is not extended to drain region 60.

In the semiconductor devices according to the first through third embodiments, the sizes in a horizontal plane of the lateral MOSFET containing a vertical surge absorber therein are small, since first and second n-type wells 41 and 42 are in contact with each other.

Figure 4:
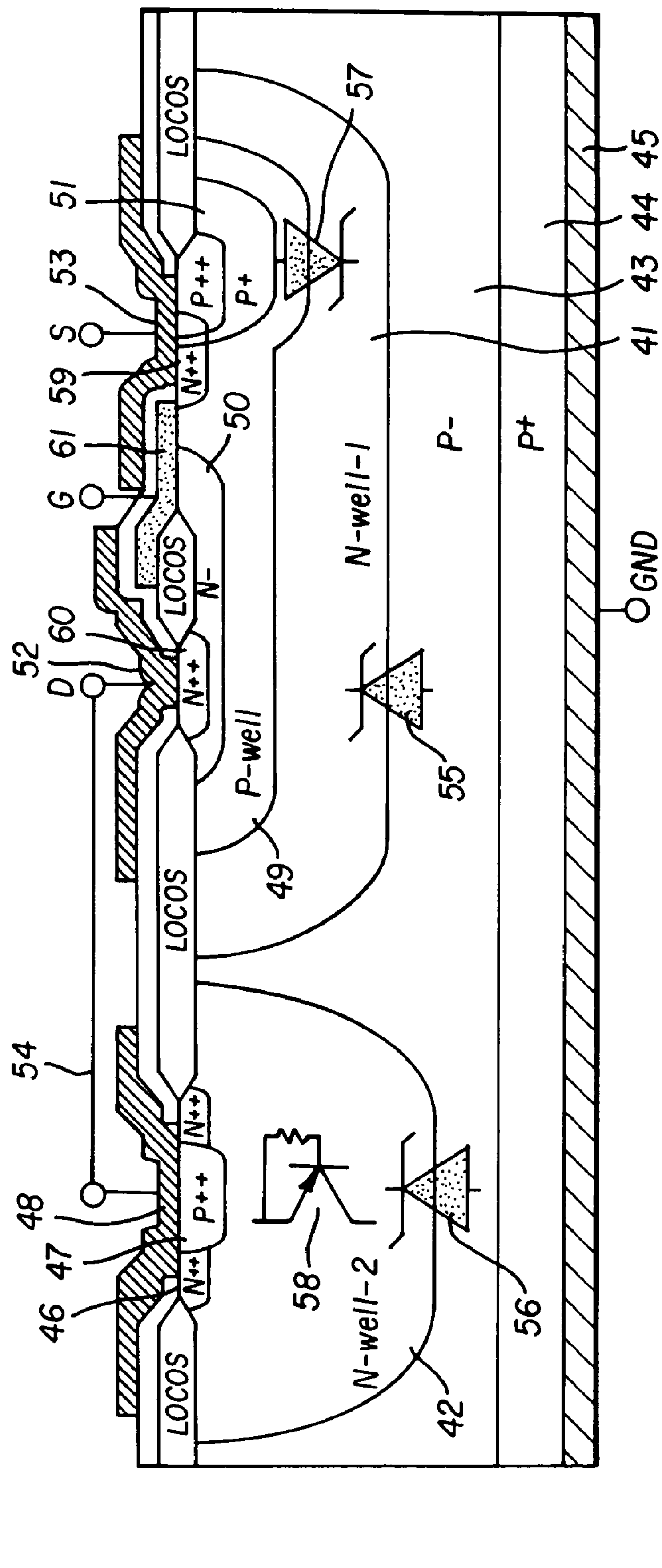
FIG. 4 is a cross sectional view of a semiconductor device according to a fourth embodiment of the invention.

FIG. 4 is a cross sectional view of a semiconductor device according to a fourth embodiment of the invention. Referring now to FIG. 4, the semiconductor device according to the fourth embodiment includes a first n-type well region 41 and a second n-type well region 42 not in contact with first n-type well region 41. In other words, first n-type well region 41 and second n-type well region 42 are spaced apart from each other.

Figure 5:
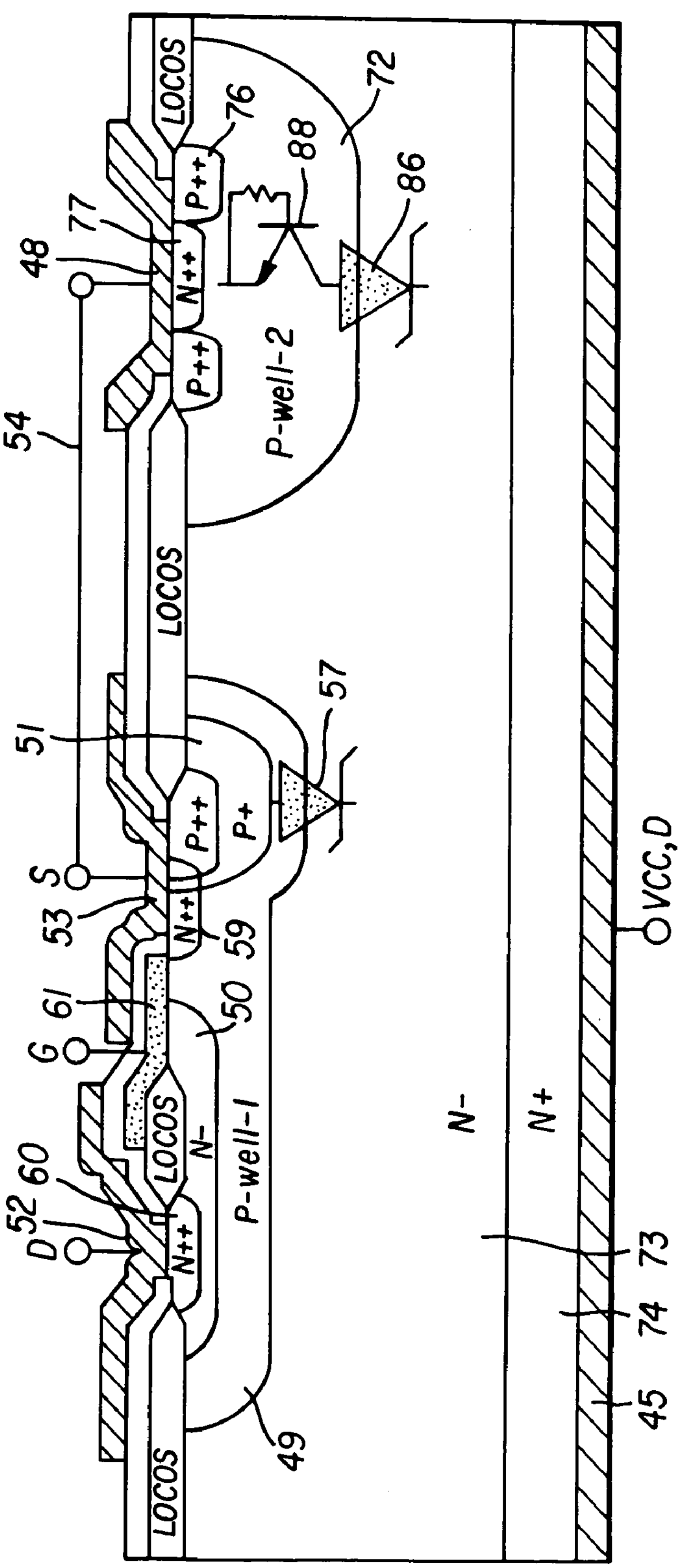
FIG. 5 is a cross sectional view of a semiconductor device according to a fifth embodiment of the invention.

FIG. 5 is a cross sectional view of a semiconductor device according to a fifth embodiment of the invention. Referring now to FIG. 5, the semiconductor device according to the fifth embodiment utilizes a vertical npn bipolar transistor, the circuit diagram thereof is designated by the reference numeral 88, as a vertical surge absorber. The semiconductor device according to the fifth embodiment includes a heavily doped n-type semiconductor substrate 74 and an epitaxial layer 73 on n-type semiconductor substrate 74. Epitaxial layer 73 is doped more lightly than n-type semiconductor substrate 74.

In the same manner as in the semiconductor device according to the first embodiment, a first p-type well region 49 is in the surface portion of n-type epitaxial layer 73. A lateral MOSFET, formed of an n-type expanded drain region 50, a drain region 60, a drain electrode 52, a p-type region 51, a source region 59, a source electrode 53, a gate oxide film, and a gate electrode 61, is formed in first p-type well region 49.

Vertical npn bipolar transistor 88 is formed in a second p-type well region 72 formed in the surface portion of n-type epitaxial layer 73. A p-type base region 76 and an n-type emitter region 77 are in the surface portion of second p-type well region 72. Vertical npn bipolar transistor 88 is formed of p-type base region 76, n-type emitter region 77, and the substrate working as a collector region.

Base region 76 and emitter region 77 are short-circuited to each other by a surface electrode 48. Surface electrode 48 is connected electrically to source electrode 53 of the lateral MOSFET via metal electrode wiring 54. Surface electrode 48 and source electrode 53 are biased, for example, at the earth potential. A back surface electrode 45 is biased, for example, at the power supply potential or at the drain potential.

In the semiconductor device according to the fifth embodiment, a vertical Zener diode 86 is formed across the pn-junction plane between second p-type well region 72 and n-type epitaxial layer 73. A parasitic diode 57 is formed across the pn-junction plane between first p-type well region 49 and n-type epitaxial layer 73. When the semiconductor substrate is an n-type, a vertical Zener diode may be used as a vertical surge absorber in the same manner as according to the third embodiment.

Figure 6:
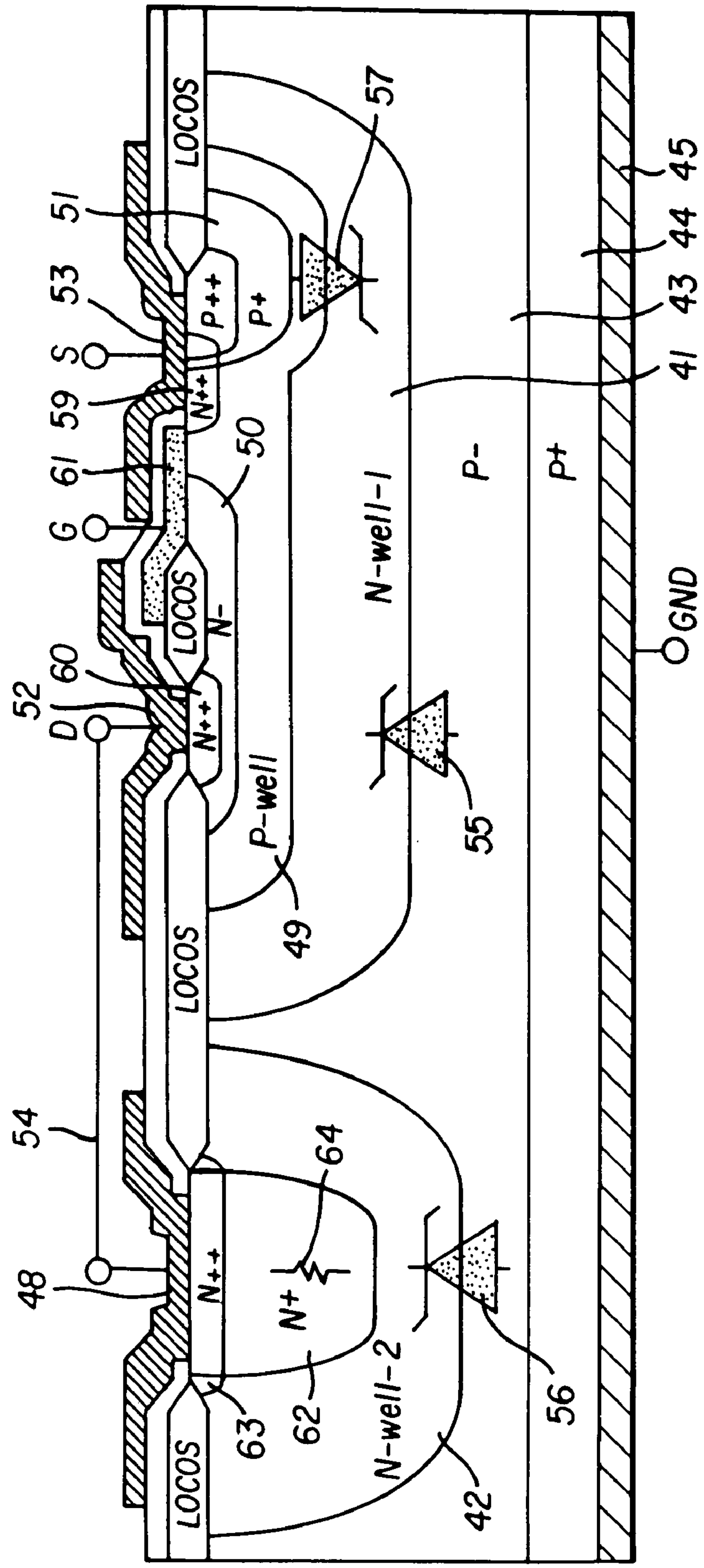
FIG. 6 is a cross sectional view of a semiconductor device according to a sixth embodiment of the invention.

FIG. 6 is a cross sectional view of a semiconductor device according to a sixth embodiment of the invention. Referring now to FIG. 6, the semiconductor device according to the sixth embodiment includes a first n-type well region 41 and a second n-type well region 42 not in contact with first n-type well region 41. In other words, first n-type well region 41 and second n-type well region 42 are spaced apart from each other. The semiconductor device according to the sixth embodiment utilizes a vertical Zener diode 56 for a vertical surge absorber. Since the semiconductor device according to the sixth embodiment does not include any vertical bipolar transistor as designated by the reference numeral 58 in FIG. 1, the semiconductor device according to the sixth embodiment does not include any base region as designated by the reference numeral 46 in FIG. 1 nor any emitter region as designated by the reference numeral 47 in FIG. 1. The semiconductor device according to the sixth embodiment includes a heavily doped n-type region 62 in second n-type well region 42 in the same manner as the semiconductor device according to the third embodiment. The n-type region 62 is connected electrically to a surface electrode 48 via an n-type region 63 doped more heavily than n-type region 62. Diffusion resistance 64 of n-type region 62 is shown in FIG. 6.

When the well region on the side on which the vertical surge absorber is formed, and the well region on the side on which the lateral MOSFET is formed, are spaced apart from each other, the carriers diffusing laterally are prevented from injecting into the well region on the side of the lateral MOSFET even while the vertical surge absorber is working to absorb the applied electrostatic discharge and the adverse influence of the applied electrostatic discharge on the lateral MOSFET is further reduced. Therefore, the structure, in which the well region on the side on which the vertical surge absorber is formed, and the well region on the side on which the lateral MOSFET is formed, are in contact with each other (that is the structure according to the first through third embodiments) or the structure, in which the well region on the side, on which the vertical surge absorber is formed, and the well region on the side on which the lateral MOSFET is formed, are spaced apart each other (that is the structure according to the fourth through sixth embodiments) is selected considering whether the primary interest is chip area reduction or improvement of the ESD withstanding capability.

In the semiconductor device according to any of the first through fourth embodiments, the relations between the diffusion depth and the impurity concentration of second n-type well region 42 and the resistivity and the thickness of p-type epitaxial layer 43 determine the breakdown voltages of vertical pnp bipolar transistor 58 and vertical Zener diode 56. In the semiconductor device according to the fifth embodiment, the relations between the diffusion depth and the impurity concentration of second p-type well region 72 and the resistivity and the thickness of n-type epitaxial layer 73 determine the breakdown voltages of vertical npn bipolar transistor 88 and vertical Zener diode 86. In any of the semiconductor devices according to the first through fifth embodiment, the conditions, under which punch-through or reach-through is caused between second n-type well region 42 and p-type semiconductor substrate 44 or between second p-type well region 72 and n-type semiconductor substrate 74, reduce the working resistance and improve the ESD withstanding capability per a unit area (cf. FIG. 17).

In detail, the breakdown voltages of vertical pnp bipolar transistor 58 and second vertical Zener diode 56 are lower than the breakdown voltage of the junction between first n-type well region 41, in which the lateral MOSFET is formed, and p-type epitaxial layer 43. The breakdown voltages of vertical npn bipolar transistor 88 and second vertical Zener diode 86 are lower than the breakdown voltage of the junction between p-type well region 49, in which the lateral MOSFET is formed, and n-type epitaxial layer 73. The resistivity of p-type epitaxial layer 43 or n-type epitaxial layer 73 is from 0.3 to 10 Ωcm. The resistivity of p-type semiconductor substrate 44 or n-type semiconductor substrate 74 is 0.1 Ωcm or lower.

Figure 7A:
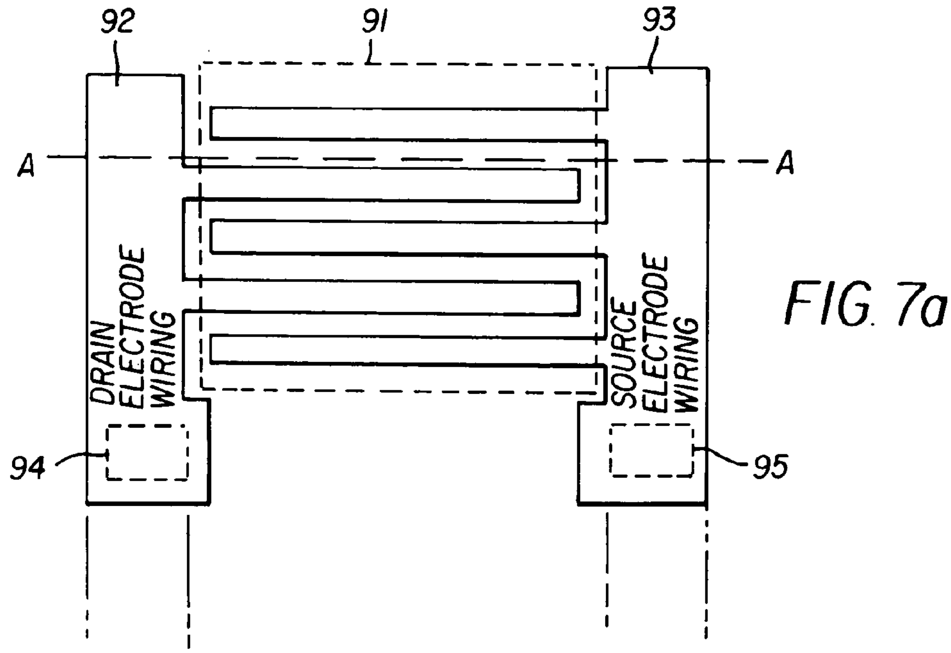
FIG. 7(*a*) is a top plan view schematically showing the planar layout.
Figure 7B:
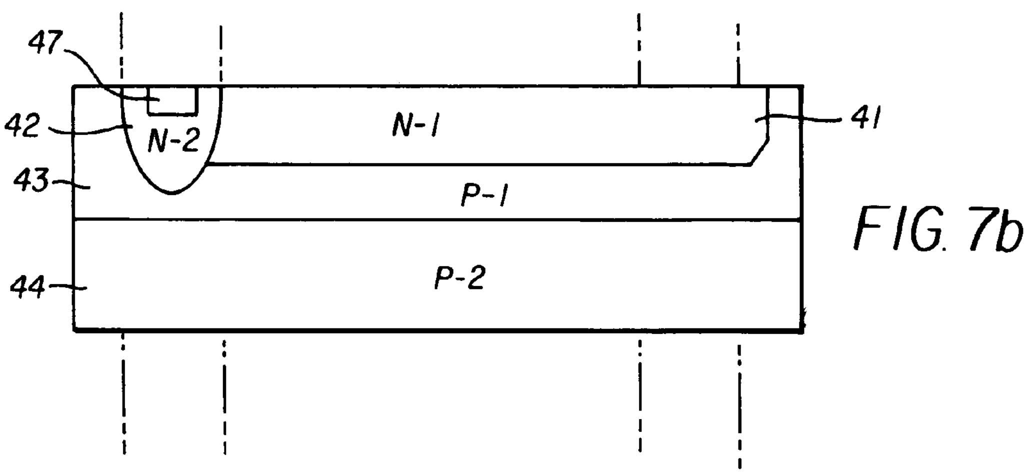
Figure 7C:
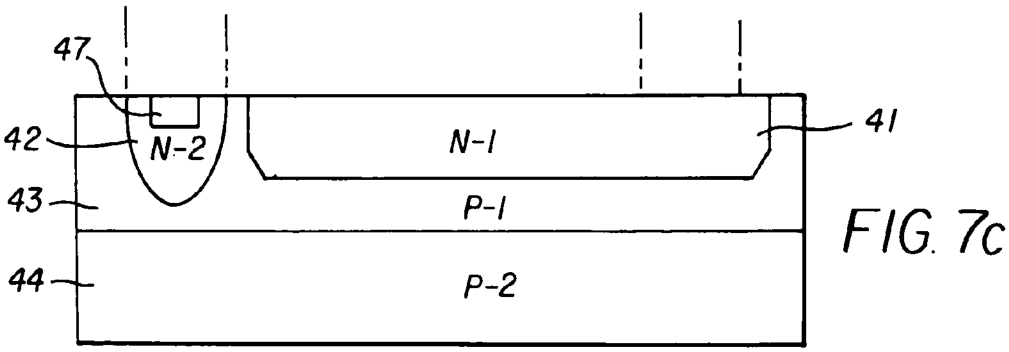

FIGS. 7(*a*) through 7(*c*) show examples of arrangement which facilitate realizing one of the most efficient chip layouts. FIG. 7(*a*) is a top plan view schematically showing the planar layout. FIG. 7(*b*) is a schematic cross sectional view along the line A—A of FIG. 7(*a*). FIG. 7(*c*) is another schematic cross sectional view along the line A—A of FIG. 7(*a*). Referring now to FIG. 7(*a*), it is usually necessary to provide a lateral MOSFET 91 with electrode wiring 92 and electrode wiring 93 for connecting the drain electrode and the source electrode of lateral MOSFET 91 to the respective pad regions and regions for wire bonding pads 94 and 95. The ratio of the area for the vertical surge absorber and the total chip area is reduced by forming the vertical surge absorber beneath electrode wiring 92 and electrode wiring 93 or beneath the regions for wire bonding pads 94 and 95. FIG. 7(*b*) is the cross sectional view of the semiconductor device, for example, according to the first embodiment. FIG. 7(*c*) is the cross sectional view of the semiconductor device, for example, according to the fourth embodiment.

The semiconductor device according to the first mode for carrying out the invention which employs vertical bipolar transistor 58 or 88 for a vertical surge absorber facilitates preventing the lateral MOSFET from being broken down, since vertical bipolar transistor 58 or 88 works in response to the applied high electrostatic discharge voltage or the applied high surge voltage to absorb the electrostatic discharge or the surge energy and suppresses the electrostatic discharge voltage or the surge voltage below the breakdown voltage of the lateral MOSFET. During the usual operation of the MOSFET, the operations of vertical bipolar transistor 58 or 88 do not affect adversely the operations of the lateral MOSFET, since vertical bipolar transistor 58 or 88 works as vertical Zener diode 56 or 86. The semiconductor device which employs vertical Zener diode 56 for a vertical surge absorber facilitates preventing the lateral MOSFET from being broken down, since vertical Zener diode 56 works in response to the applied high electrostatic discharge voltage or the applied high surge voltage to absorb the electrostatic discharge or the surge energy and suppresses the electrostatic discharge voltage or the surge voltage below the breakdown voltage of the lateral MOSFET. The vertical surge absorber which does not induce any parasitic operation in the lateral directions facilitates reducing the chip size, since the vertical surge absorber which does not induce any parasitic operation in the lateral directions facilitates obtaining a high ESD withstanding capability and a high surge withstanding capability with a device area narrower than that of the conventional lateral surge absorber.

Second Mode

The semiconductor device according to a second mode for carrying out the invention includes a lateral MOSFET and a vertical surge absorber formed on a same semiconductor substrate without provision of any specific isolation structure, and an electrically conductive semiconductor resistor connecting the gate electrode of the lateral MOSFET and the surface electrode of the vertical surge absorber. The invention will be described hereinafter with reference to the accompanied drawing figures which illustrate a seventh, eighth, and ninth embodiment of the invention. In describing the eighth and ninth embodiments, the same reference numerals as used in describing the seventh embodiment will be used to designate the same constituent elements and their duplicated descriptions will be omitted for the sake of simplicity.

Figure 8:
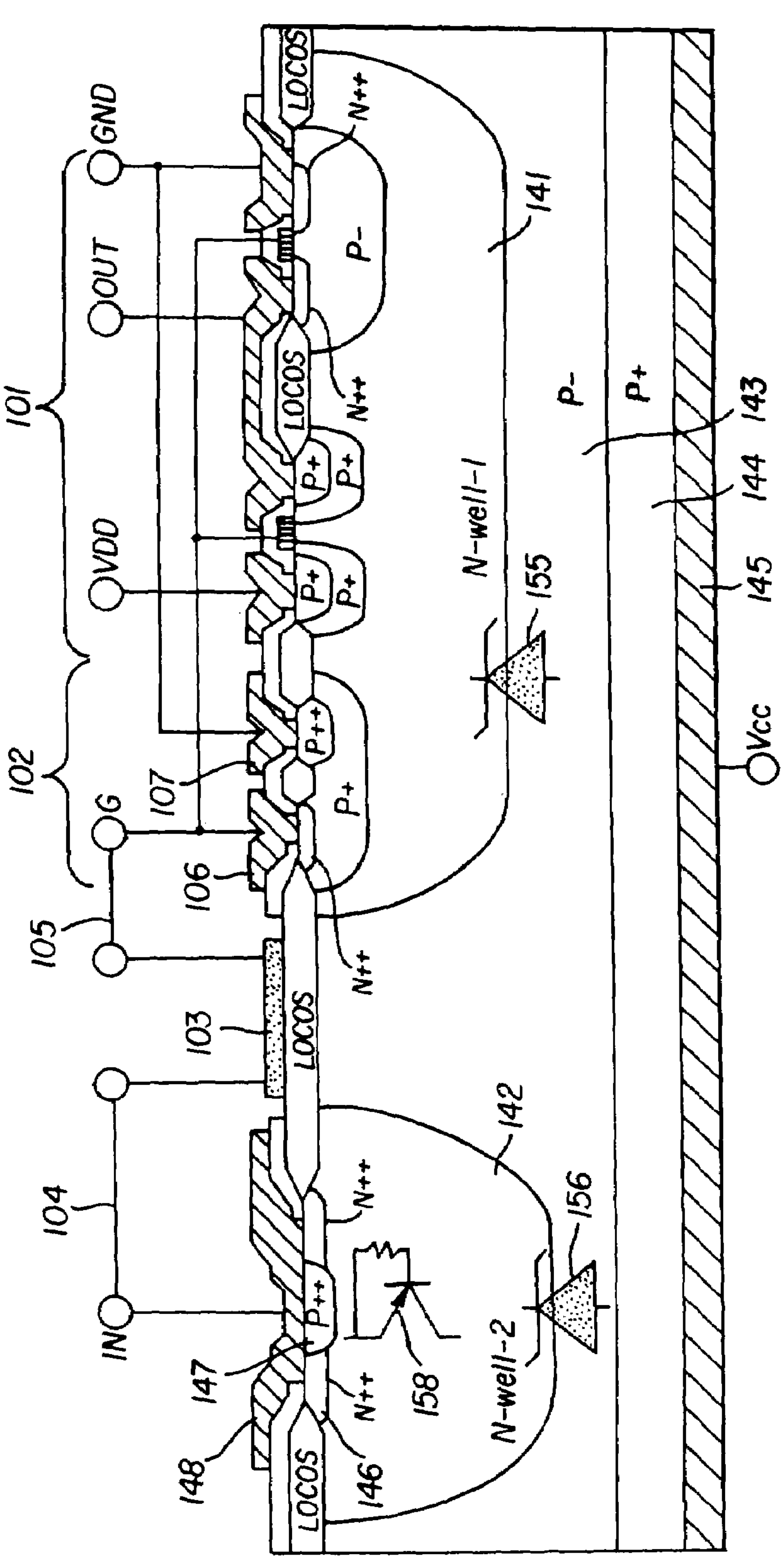
FIG. 8 is a cross sectional view of a semiconductor device according to a seventh embodiment of the invention.
Figure 9:
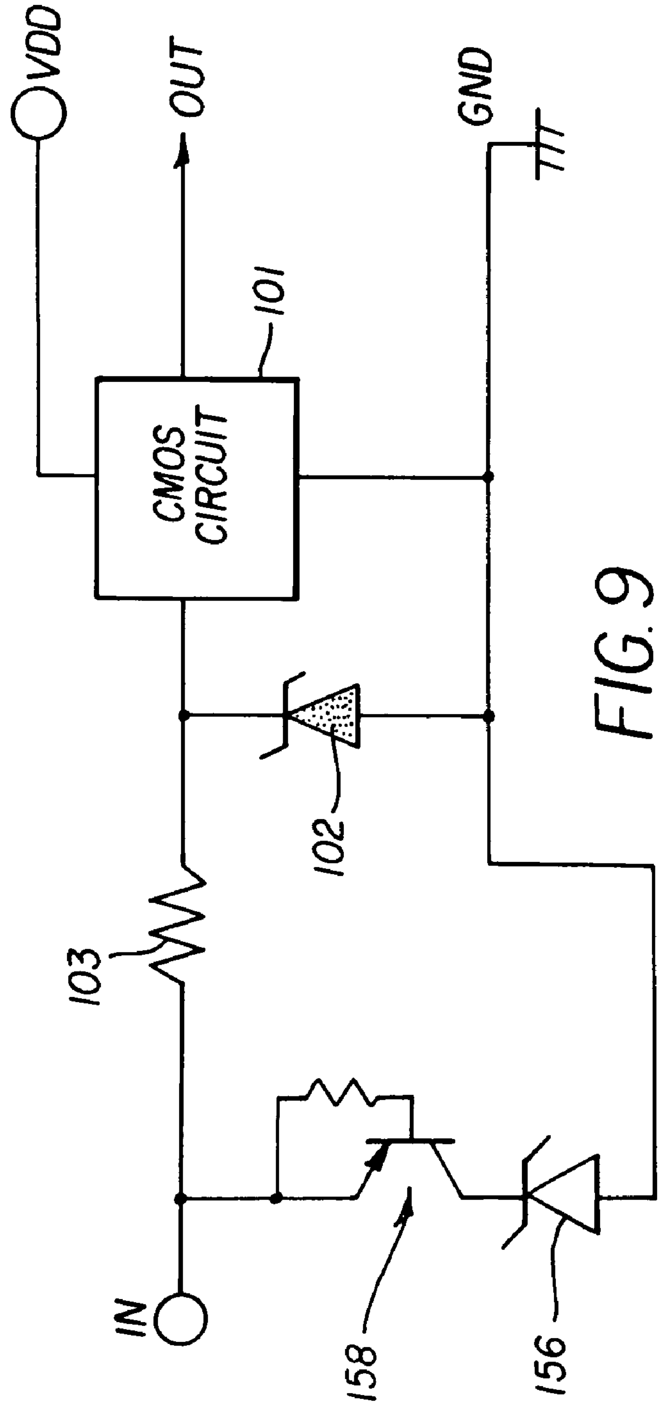
FIG. 9 is a an equivalent circuit diagram of the semiconductor device shown in FIG. 8.

FIG. 8 is a cross sectional view of a semiconductor device according to the seventh embodiment of the invention. FIG. 9 is an equivalent circuit diagram of the semiconductor device shown in FIG. 8. Referring now to FIG. 8, the semiconductor device according to the seventh embodiment includes a heavily doped p-type semiconductor substrate 144 and a p-type epitaxial layer 143 on p-type semiconductor substrate 144. The p-type epitaxial layer 143 is doped more lightly than p-type semiconductor substrate 144. A first n-type well region 141 and a second n-type well region 142 spaced apart from first n-type well region 141 are in the surface portion of p-type semiconductor substrate 144.

A CMOS circuit 101 formed of a lateral MOSFET and an internal-voltage-cramping Zener diode 102 for cramping the internal voltage are in first n-type well region 141. An n-type base region 146 and a p-type emitter region 147 are in the surface portion of second n-type well region 142. A vertical pnp bipolar transistor working as a vertical surge absorber is formed of base region 146, emitter region 147 and the substrate working as the collector region thereof. In FIG. 8, the circuit diagram of the vertical pnp bipolar transistor designated by the reference numeral 158 is shown. CMOS circuit 101 and Zener diode 102 are isolated from vertical pnp bipolar transistor 158 by a LOCOS oxide film.

A surface electrode 148 working as an input terminal for inputting analog and digital signals to CMOS circuit 101 is on the substrate surface, below which vertical pnp bipolar transistor 158 is formed. Surface electrode 148 is in contact with base region 146 and emitter region 147. Therefore, base region 146 and emitter region 147 are short-circuited with each other. Surface electrode 148 is connected electrically to an end of a polysilicon semiconductor resistor 103 via metal electrode wiring 104.

Another end of polysilicon semiconductor resistor 103 is connected electrically to the cathode electrode 106 of Zener diode 102 via metal electrode wiring 105. Cathode electrode 106 is connected electrically to the gate electrode of CMOS circuit 101. The anode electrode 107 of Zener diode 102 and the source electrode of an NMOS transistor in CMOS circuit 101 are biased at the earth potential. The source electrode of a PMOS transistor in CMOS circuit 101 is biased at a power supply potential VDD. The output of CMOS circuit 101 is obtained from the common drain of the NMOS transistor and the PMOS transistor. A back electrode 145 is on the back surface of the substrate and biased, for example, at the earth potential.

In the semiconductor device described above, a first vertical Zener diode 155 is formed across the pn-junction plane between p-type epitaxial layer 143 and first n-type well region 141. A second Zener diode 156 is formed across the pn-junction plane between p-type epitaxial layer 143 and second n-type well region 142.

In the same way as according to the first mode for carrying out the invention, the operations and the conditions of vertical pnp bipolar transistor 158 and second vertical Zener diode 156 are adjusted so that the breakdown voltage, which would break down polysilicon semiconductor resistor 103, the lateral MOSFET in CMOS circuit 101 and internal-voltage-cramping Zener diode 102, is not realized when electrostatic discharge is caused. The impurity concentration and the thickness of the semiconductor substrate are adjusted appropriately to secure a better ESD withstanding capability.

Figure 10:
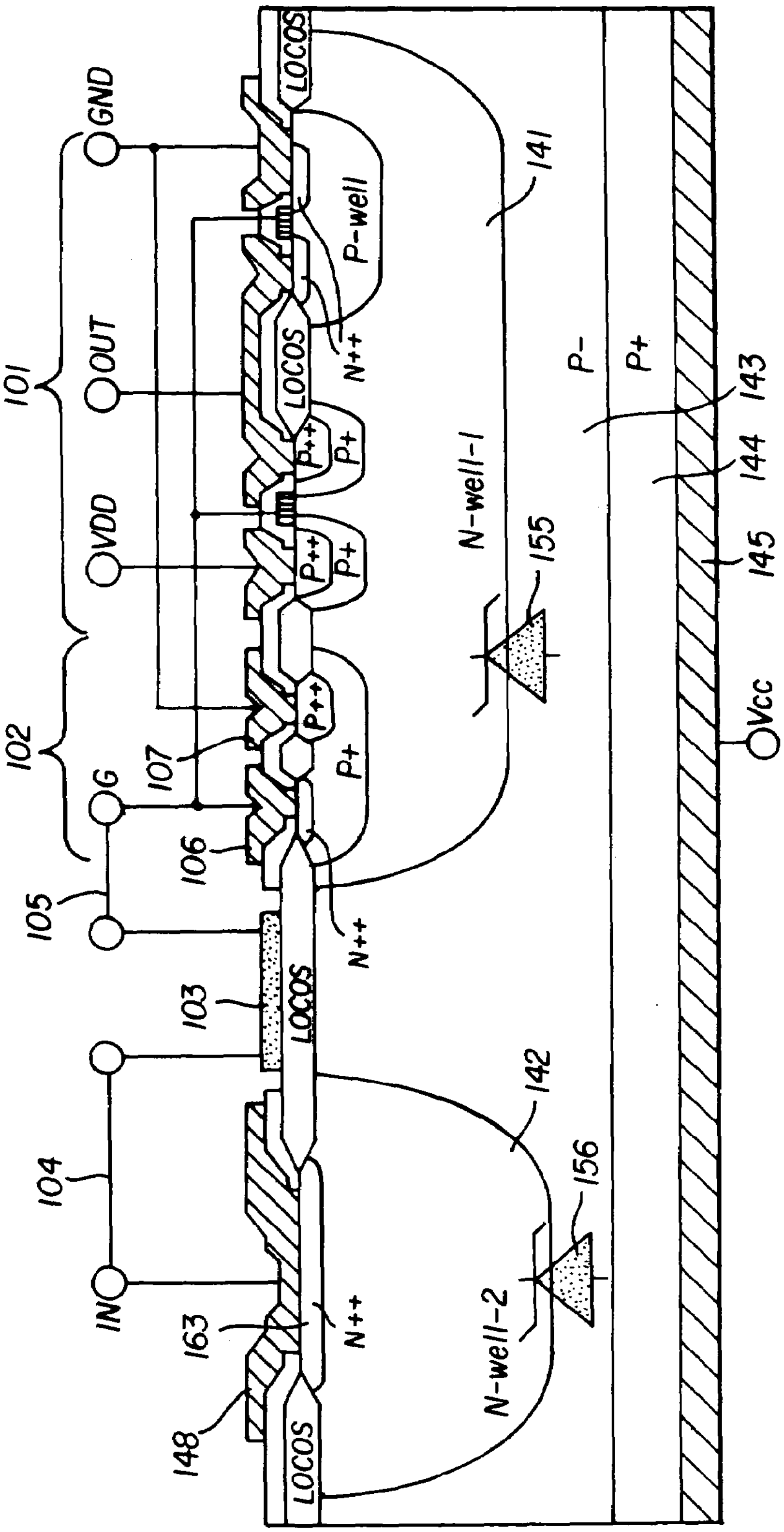
FIG. 10 is a cross sectional view of a semiconductor device according to an eighth embodiment of the invention.
Figure 11:
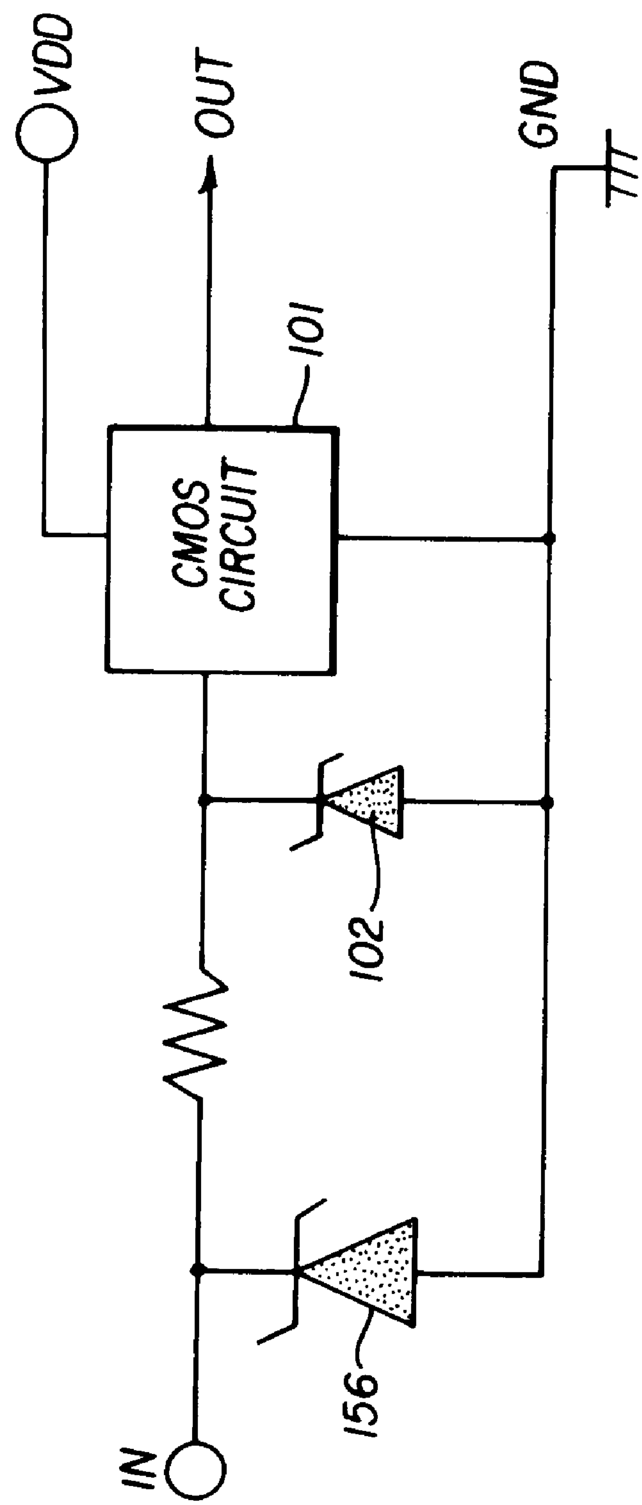
FIG. 11 is an equivalent circuit diagram of the semiconductor device shown in FIG. 10.

FIG. 10 is a cross sectional view of a semiconductor device according to an eighth embodiment of the invention. FIG. 11 is an equivalent circuit diagram of the semiconductor device shown in FIG. 10. Referring now to FIG. 10, the semiconductor device according to the eighth embodiment employs a vertical Zener diode 156 as a vertical surge absorber. Since the semiconductor device according to the eighth embodiment does not include any vertical bipolar transistor as designated by the reference numeral 158 in FIG. 8, the semiconductor device according to the eighth embodiment does not include any base region as designated by the reference numeral 146 in FIG. 8 nor any emitter region as designated by the reference numeral 147 in FIG. 8. Instead, a heavily doped n-type region 163 in contact with surface electrode 148 is formed in the surface portion of second well region 142.

Figure 12:
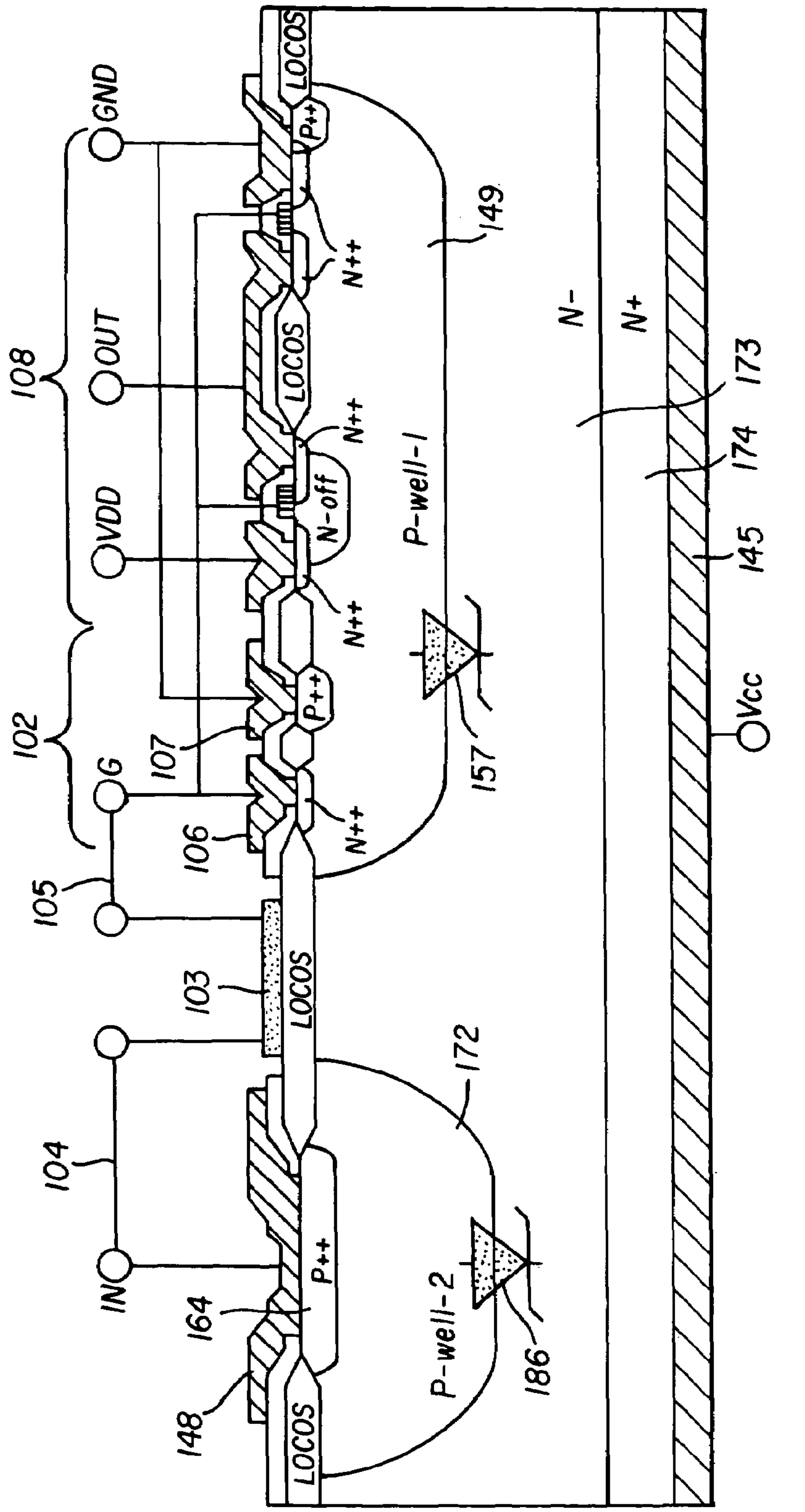
FIG. 12 is a cross sectional view of a semiconductor device according to a ninth embodiment of the invention.
Figure 13:
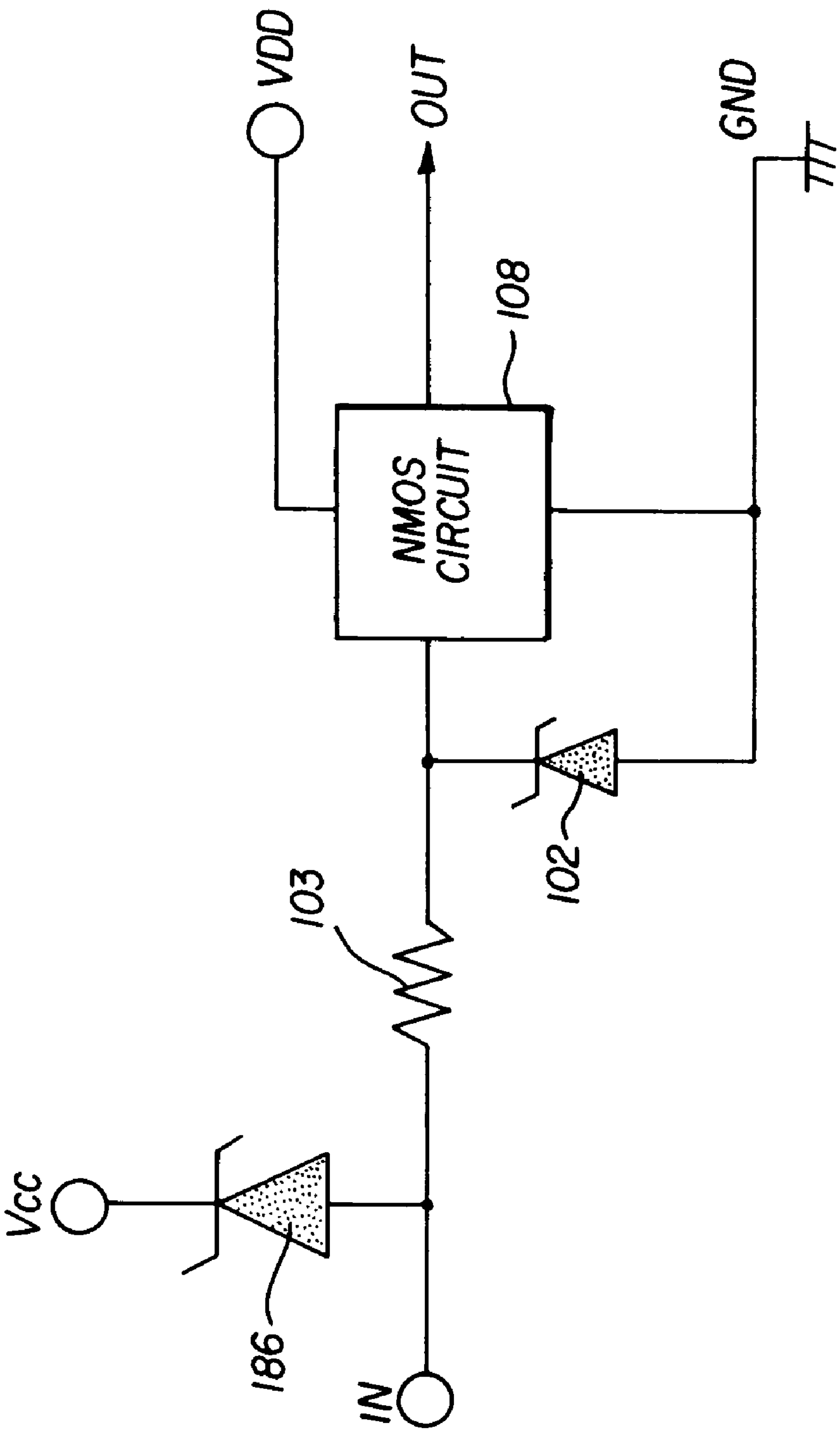
FIG. 13 is an equivalent circuit diagram of the semiconductor device shown in FIG. 12.

FIG. 12 is a cross sectional view of a semiconductor device according to a ninth embodiment of the invention. FIG. 13 is an equivalent circuit diagram of the semiconductor device shown in FIG. 12. Referring now to FIG. 12, the semiconductor device according to the ninth embodiment includes a heavily doped n-type semiconductor substrate 174 and an n-type epitaxial layer 173 formed on semiconductor substrate 174 and doped more lightly than semiconductor substrate 174. An NMOS circuit 108 formed of a lateral MOSFET and an internal-voltage-cramping Zener diode 102 for cramping the internal voltage are in a first p-type well region 149.

A vertical Zener diode 186 working as a vertical surge absorber is formed across the pn-junction plane between a second p-type well region 172 and n-type epitaxial layer 173. A heavily doped p-type region 164 in contact with surface electrode 148 for inputting analog and digital signals to NMOS circuit 108 is formed in the surface portion of second p-type well region 172. NMOS circuit 108 and internal-voltage-cramping Zener diode 102 are isolated from vertical Zener diode 186 by a LOCOS oxide film.

Surface electrode 148 is connected electrically to an end of a polysilicon semiconductor resistor 103 via metal electrode wiring 104. Another end of polysilicon semiconductor resistor 103 is connected electrically to the cathode electrode 106 of Zener diode 102 via metal electrode wiring 105. Cathode electrode 106 is connected electrically to the gate electrode of NMOS circuit 108. The anode electrode 107 of Zener diode 102 and the source electrode of the NMOS transistor in NMOS circuit 108 are biased at the earth potential. A back electrode 145 is on the back surface of the substrate and biased, for example, at the power supply potential.

In the semiconductor device described above, a first vertical Zener diode 157 is formed across the pn-junction plane between first p-type well region 149 and n-type epitaxial layer 173. The operations and the conditions of second vertical Zener diode 186 are adjusted so that the voltage, which would break down polysilicon semiconductor resistor 103, the lateral MOSFET in NMOS circuit 108 and internal-voltage-cramping Zener diode 102, is not reached when electrostatic discharge occurs. The impurity concentration and the thickness of the semiconductor substrate are adjusted appropriately to secure a better ESD withstanding capability.

The semiconductor device according to the second mode for carrying out the invention facilitates preventing an over voltage from being applied to the gate electrode of the lateral MOSFET in CMOS circuit 101 or in NMOS circuit 108 and preventing the lateral MOSFET from being broken down, since vertical pnp bipolar transistor 158 and second Zener diode 156 or 186 absorb the electrostatic discharge energy to limit the electrostatic discharge voltage applied to the input terminal IN to a small value and internal-voltage-cramping Zener diode 102 also limits the internal voltage. Since the semiconductor device according to the second mode facilitates forming the vertical surge absorber thereof beneath surface electrode 148 working as a wire bonding pad, the semiconductor device according to the second mode facilitates obtaining the ESD withstanding capability equivalent to that of the conventional lateral surge absorber with a device area narrower than half the device area of the conventional lateral surge absorber.

Third Mode

Figure 14:
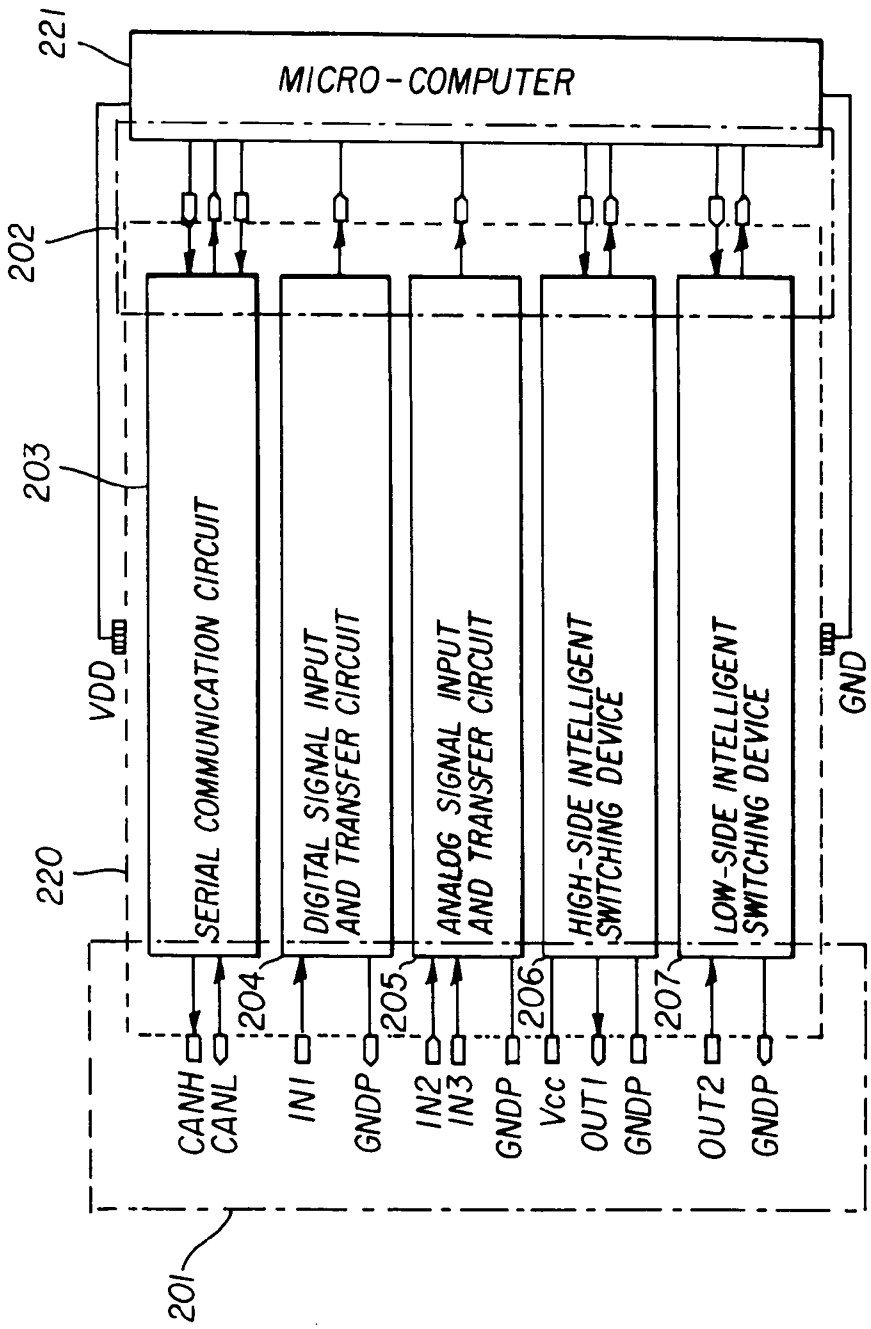
FIG. 14 is a block diagram showing a fundamental circuit combination for a combined power IC according to a tenth embodiment of the invention.

FIG. 14 is a block diagram showing a fundamental circuit combination for a combined power IC according to the tenth embodiment of the invention. Referring now to FIG. 14, the combined power IC 220 combines a serial communication circuit 203, a digital signal input and transfer circuit 204, an analog signal input and transfer circuit 205, a high-side intelligent switching device 206 and a low-side intelligent switching device 207. The circuits 203, 204, 205 and the switching deices 206, 207 are connected to the outside via an input-output terminal section 201 exhibiting a high ESD withstanding capability and to a microcomputer 221 via a microcomputer signal connection terminal 202.

Figure 15:
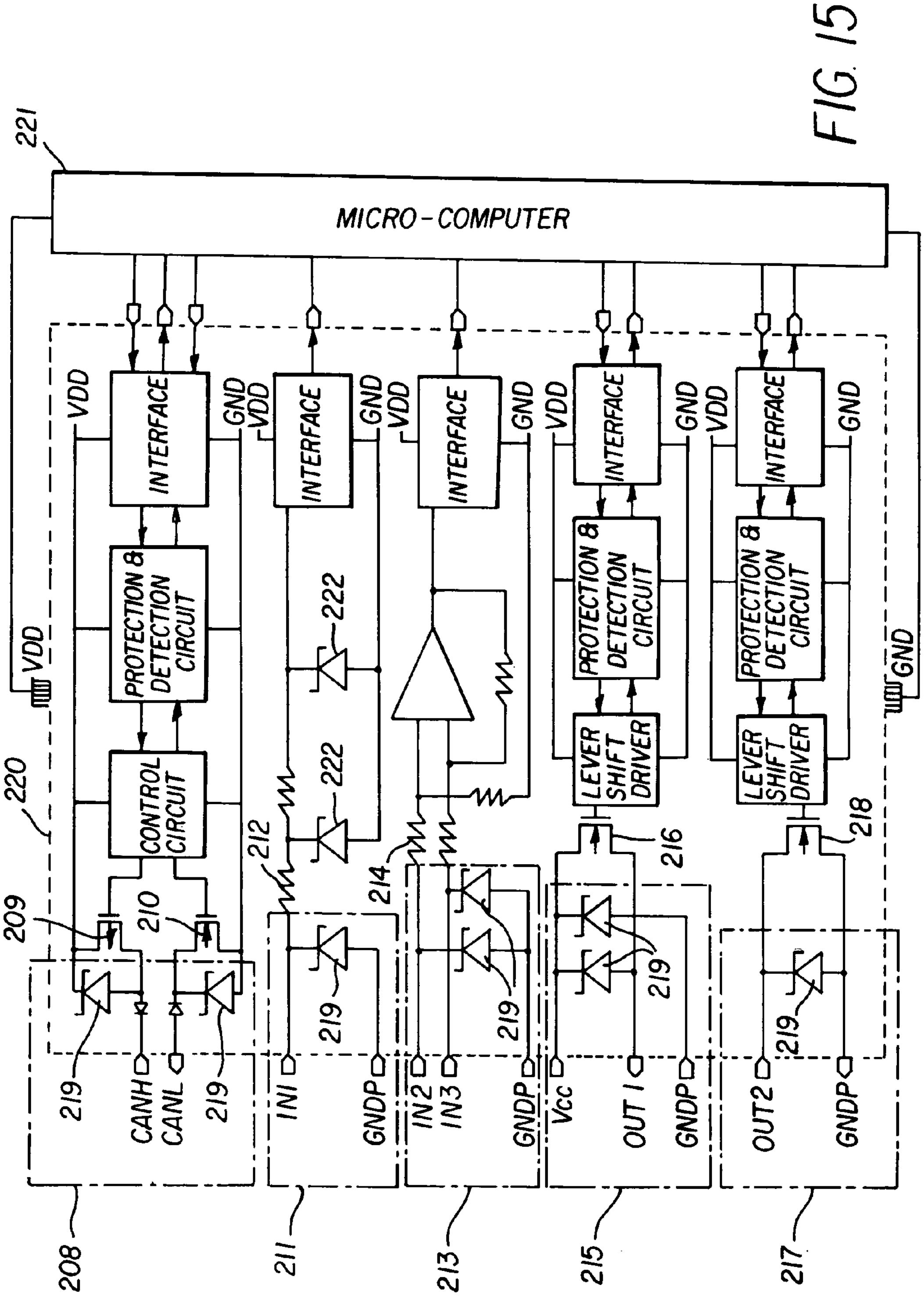
FIG. 15 is a block circuit diagram showing a connection of vertical surge absorbers in the combined power IC of FIG. 14.

FIG. 15 is a block circuit diagram showing a connection of vertical surge absorbers in the combined power IC of FIG. 14. Referring now to FIG. 15, vertical surge absorbers 219 are connected between the source and drain of a lateral p-channel MOSFET 209 and between the source and drain of a lateral n-channel MOSFET 210 in serial communication circuit 203. Lateral MOSFET's 209 and 210 are connected to a serial communication input-output port 208 in input-output terminal section 201. In digital signal input and transfer circuit 204, a vertical surge absorber 219 is connected to a polysilicon semiconductor resistor 212 connected to a digital signal input port 211 in input-output terminal section 201 and to an internal-voltage-cramping Zener diode 222. Surge absorber 219 in digital signal input and transfer circuit 204 is connected via polysilicon semiconductor resistor 212 and internal-voltage-cramping Zener diode 222 to the n-type well region or to the p-type well region, wherein circuit elements are formed.

In analog signal input and transfer circuit 205, vertical surge absorbers 219 are connected to a polysilicon semiconductor resistor 214 connected to an analog signal differential input port 213 in input-output terminal section 201. Surge absorbers 219 in analog signal input and transfer circuit 205 are connected via a polysilicon semiconductor resistor 214 to the n-type well region or to the p-type well region, wherein circuit elements are formed.

In high-side intelligent switching device 206, vertical surge absorbers 219 are connected between the source and the drain of a lateral power MOSFET 216 and between the drain of MOSFET 216 and the earth terminal (GNDP). MOSFET 216 is connected to a high-side output port 215 in input-output terminal section 201. In low-side intelligent switching device 207, a vertical surge absorber 219 is connected between the source and the drain of a lateral MOSFET 218 connected to a low-side output port 217 in input-output terminal section 201.

Serial communication input-output port 208, digital signal input port 211, analog signal differential input port 213, high-side output port 215, and low-side output port 217 are required to exhibit high ESD withstanding capabilities and high surge withstanding capabilities. Serial communication input-output port 208, digital signal input port 211, analog signal differential input port 213, high-side output port 215, and low-side output port 217 are connected to not shown external instruments, external devices, relays, and motors via not shown external wiring.

Since serial communication circuit 203, digital signal input and transfer circuit 204, analog signal input and transfer circuit 205, high-side intelligent switching device 206, and low-side intelligent switching device 207 exhibit the respective high ESD withstanding capabilities and the respective high surge withstanding capabilities, combined power IC 220 according to the tenth embodiment of the invention is provided with a high ESD withstanding capability and a high surge withstanding capability. Microcomputer 221 is sensitive to surges. External instruments and external devices, relays, and motors are liable to cause surges. However, combined power IC 220 according to the tenth embodiment facilitates performing the fundamental roles of connecting microcomputer 221 to the outside such as transmitting data, detecting signals, and outputting signals and power to the outside.

Although the invention has been described so far in connection with the preferred embodiments thereof, changes and modifications are obvious to those skilled in the art without departing from the gist of the invention. For example, the invention is applicable to the semiconductor devices, in which the conductivity types are opposite to those in the semiconductor devices described above according to the embodiments of the invention. Therefore, the invention should be understood not by the specific descriptions herein but by the appended claims thereof.

The semiconductor device according to the invention absorbs electrostatic discharge and voltage surges and limits the electrostatic discharge voltage and the surge voltage without affecting the usual MOSFET operations. The device exhibits a high ESD withstanding capability and a high surge withstanding capability within an area narrower than that of the conventional lateral surge absorber while avoiding lateral parasitic breakdown. Therefore, the semiconductor device according to the invention facilitates preventing the reduction of ESD withstanding capability and surge withstanding capability in association with finer circuit integration, and prevents the chip area from being significantly widened. The semiconductor device according to the present invention can be used to realize a combined power IC and a combined communication IC exhibiting a high ESD withstanding capability and a high surge and noise withstanding capability, with low manufacturing costs using a low-cost semiconductor substrate.

What is claimed:

1. A semiconductor device comprising:

a semiconductor substrate;

a first well region in the semiconductor substrate;

a second well region in the semiconductor substrate;

a lateral MOSFET in the first well region, the lateral MOSFET comprising a source electrode and a drain electrode;

a vertical surge absorber in the second well region, the vertical surge absorber comprising a surface electrode; and metal electrode wiring electrically connecting one of the source electrode or the drain electrode of the MOSFET, and the surface electrode of the vertical surge absorber, wherein the vertical surge absorber comprises a vertical bipolar transistor, and wherein the surface electrode of the vertical surge absorber contacts at least one of the base or the emitter of the vertical bipolar transistor.

2. The semiconductor device according to claim 1, wherein the vertical surge absorber is beneath the electrode wiring connecting the source electrode or the drain electrode of the lateral MOSFET to the pad region thereof.

3. The semiconductor device according to claim 1, wherein the vertical surge absorber is beneath the wire bonding pad region of the electrode wiring connecting the source electrode or the drain electrode of the lateral MOSFET to the pad region thereof.

4. The semiconductor device according to claim 1, wherein the breakdown voltage of the vertical surge absorber is lower than the breakdown voltage of the junction between the first well region and the semiconductor substrate.

5. The semiconductor device according to claim 1, further comprising a semiconductor layer of a conductivity type having the same conductivity type as the semiconductor substrate, the semiconductor layer being on the back surface of the semiconductor substrate and doped more heavily than the semiconductor substrate.

6. The semiconductor device according to claim 1, wherein the resistivity of the semiconductor substrate is from 0.3 Ωcm to 10 Ωcm.

7. The semiconductor device according to claim 5, wherein the resistivity of the semiconductor layer on the back surface of the semiconductor substrate is 0.1 Ωcm or lower.

8. The semiconductor device according to claim 5, wherein the breakdown voltage of the vertical surge absorber is determined by the relation between the junction depth and the impurity concentration of the second well region and the resistivity and the thickness of the semiconductor substrate, the relation being determined by the conditions, under which punch-through or reach-through is caused between the second well region and the semiconductor layer on the back surface of the semiconductor substrate.

9. The semiconductor device according to claim 1, wherein the vertical surge absorber is a vertical Zener diode formed across the pn-junction plane between the second well region and the semiconductor substrate.

10. A combined IC comprising an input and transfer circuit for analog signals or for digital signals, and the input and transfer circuit comprising the semiconductor device of claim 1.

11. A combined IC comprising a serial communication circuit comprising the semiconductor device of claim 1.

12. A combined IC comprising an intelligent switching device comprising the semiconductor device of claim 1.

13. A semiconductor device comprising:

a semiconductor substrate;

a first well region in the semiconductor substrate;

a second well region in the semiconductor substrate;

a lateral MOSFET in the first well region, the lateral MOSFET comprising a source electrode and a drain electrode;

a vertical surge absorber in the second well region, the vertical surge absorber comprising a surface electrode; and metal electrode wiring electrically connecting one of the source electrode or the drain electrode of the MOSFET, and the surface electrode of the vertical surge absorber, wherein the first well region and the second well region are in contact with each other.

14. A semiconductor device comprising:

a semiconductor substrate;

a first well region in the semiconductor substrate;

a second well region in the semiconductor substrate;

a lateral MOSFET in the first well region, the lateral MOSFET comprising a source electrode and a drain electrode;

a vertical surge absorber in the second well region, the vertical surge absorber comprising a surface electrode; and metal electrode wiring electrically connecting one of the source electrode or the drain electrode of the MOSFET, and the surface electrode of the vertical surge absorber, wherein the vertical surge absorber comprises a vertical bipolar transistor, and wherein the surface electrode of the vertical bipolar transistor short circuits the base and the emitter of the vertical bipolar transistor, and wherein the collector thereof comprises the semiconductor substrate.

* * * * *